US012701735B2

(12) United States Patent
Chang et al.

(10) Patent No.: US 12,701,735 B2
(45) Date of Patent: Aug. 4, 2026

(54) ISOLATION STRUCTURES

(71) Applicant: Taiwan Semiconductor Manufacturing Company, Ltd., Hsin-Chu (TW)

(72) Inventors: Feng-Ming Chang, Hsinchu County (TW); Jing-Yi Lin, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 551 days.

(21) Appl. No.: 18/194,477

(22) Filed: Mar. 31, 2023

(65) Prior Publication Data

US 2024/0332408 A1 Oct. 3, 2024

(51) Int. Cl.
*H10D 84/01* (2026.01)
*H10D 30/01* (2025.01)
(Continued)

(52) U.S. Cl.
CPC ........... *H10D 30/43* (2025.01); *H10D 30/014* (2025.01); *H10D 30/6735* (2025.01);
(Continued)

(58) Field of Classification Search
CPC ........... H10D 84/0135; H10D 84/0151; H10D 84/0188
See application file for complete search history.

(56) References Cited

U.S. PATENT DOCUMENTS

| 11,488,969 B1 | 11/2022 | Liaw |
| 2020/0052206 A1 | 2/2020 | Paz De Araujo |

(Continued)

FOREIGN PATENT DOCUMENTS

| TW | 202133451 A | 9/2021 |

OTHER PUBLICATIONS

Huang et al., "Integrated Standard Cell Structure," U.S. Appl. No. 17/837,925, filed Jun. 10, 2022, Assignee: Taiwan Semiconductor Manufacturing Company, Ltd., 30 pages specification, 51 pages drawings.

(Continued)

*Primary Examiner* — Fernando L Toledo
*Assistant Examiner* — Adam S Bowen
(74) *Attorney, Agent, or Firm* — HAYNES AND BOONE, LLP

(57) ABSTRACT

Semiconductor structures and methods are provided. An exemplary method according to the present disclosure includes forming a fin-like structure over a substrate; forming an isolation feature in the substrate and adjacent to the fin-like structure substrate; forming a dummy gate structure across the fin-like structure, where the dummy gate structure comprises a first portion disposed directly over the fin-like structure and a second portion disposed directly over a portion of the isolation feature; forming a mask film to cover the first portion of the dummy gate structure while exposing the second portion of the dummy gate structure; removing the second portion of the dummy gate structure and the portion of the isolation feature thereunder to form a gate isolation trench; forming a gate isolation structure in the gate isolation trench; and replacing the first portion of the dummy gate structure with a gate stack.

20 Claims, 18 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/03* | (2025.01) |
| *H10D 84/83* | (2025.01) |
| *H10W 10/00* | (2026.01) |
| *H10W 10/17* | (2026.01) |

(52) U.S. Cl.
CPC ....... *H10D 30/6757* (2025.01); *H10D 62/121* (2025.01); *H10D 64/017* (2025.01); *H10D 84/013* (2025.01); *H10D 84/0133* (2025.01); *H10D 84/038* (2025.01); *H10D 84/83* (2025.01); *H10W 10/014* (2026.01); *H10W 10/17* (2026.01)

(56) References Cited

U.S. PATENT DOCUMENTS

| | | | |
|---|---|---|---|
| 2021/0408022 A1* | 12/2021 | Young | H10D 30/6735 |
| 2022/0068720 A1* | 3/2022 | Jang | H10D 84/834 |
| 2022/0319928 A1 | 10/2022 | Shen | |

OTHER PUBLICATIONS

Yu-Lung Tung et al., "Integrated Standard Cell with Contact Structure," U.S. Appl. No. 17/879,836, filed Aug. 3, 2022, Assignee: Taiwan Semiconductor Manufacturing Company, Ltd., 30 pages specification, 12 pages drawings.

* cited by examiner

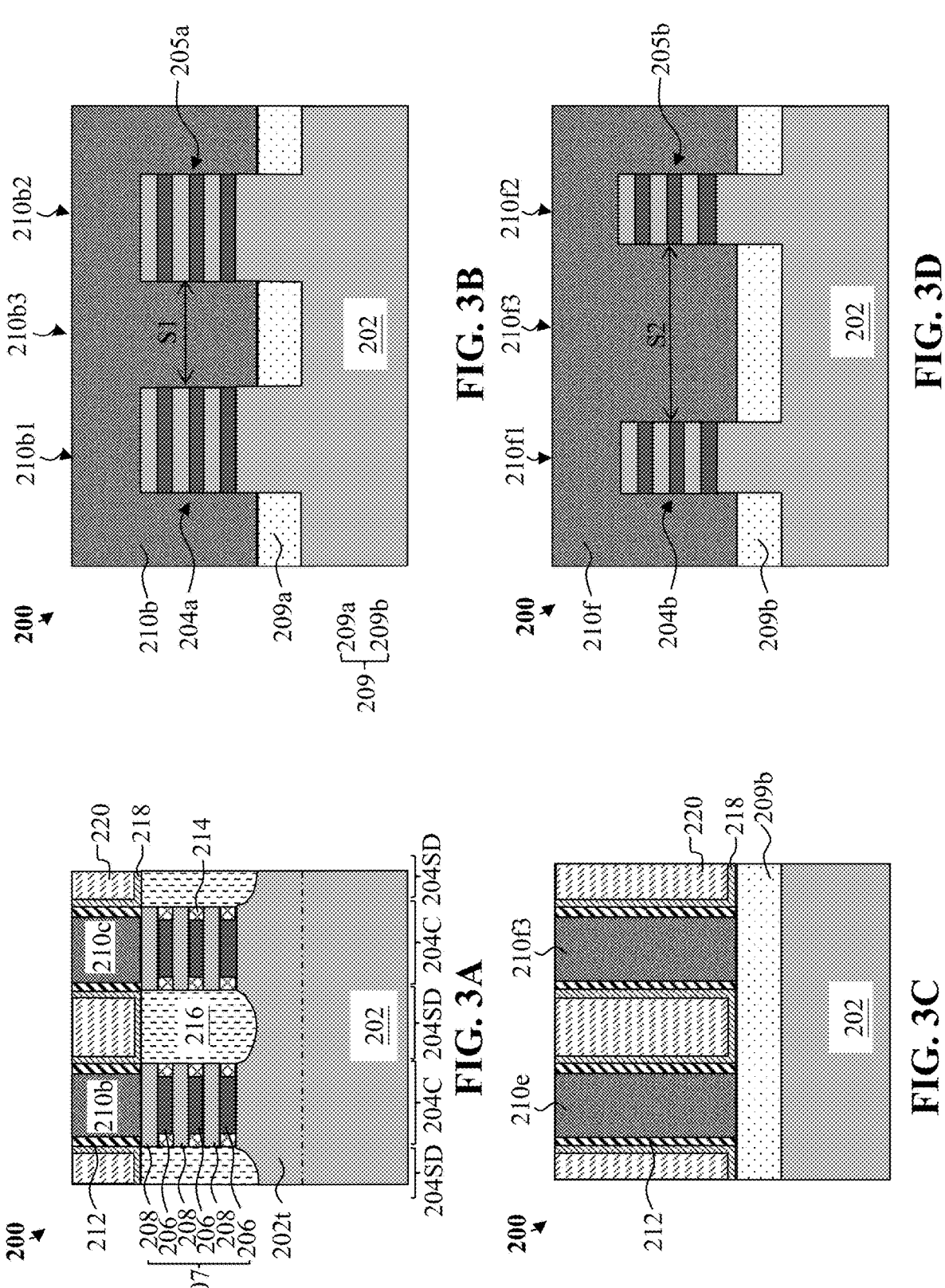

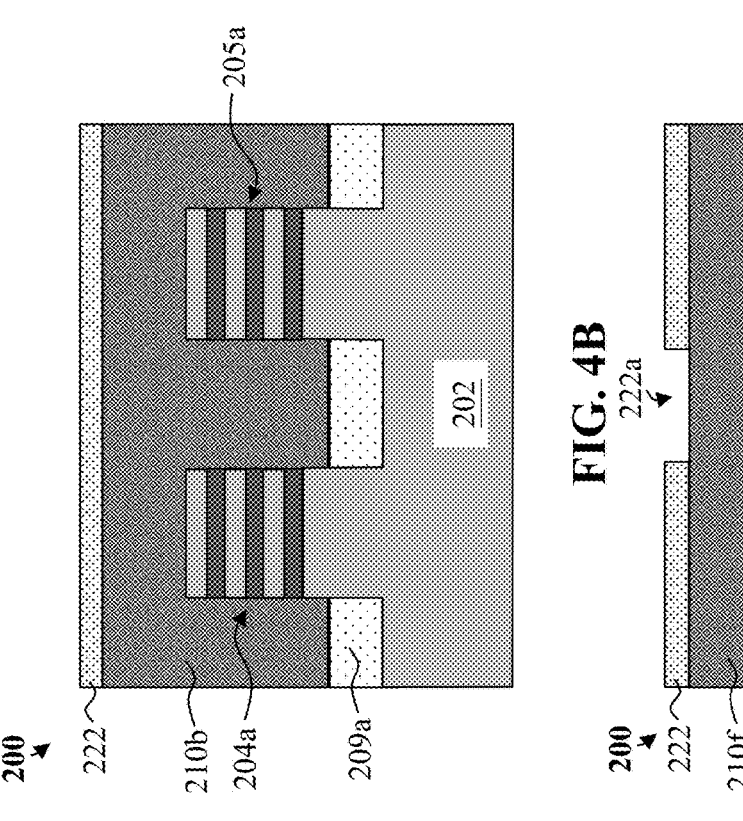
FIG. 4A
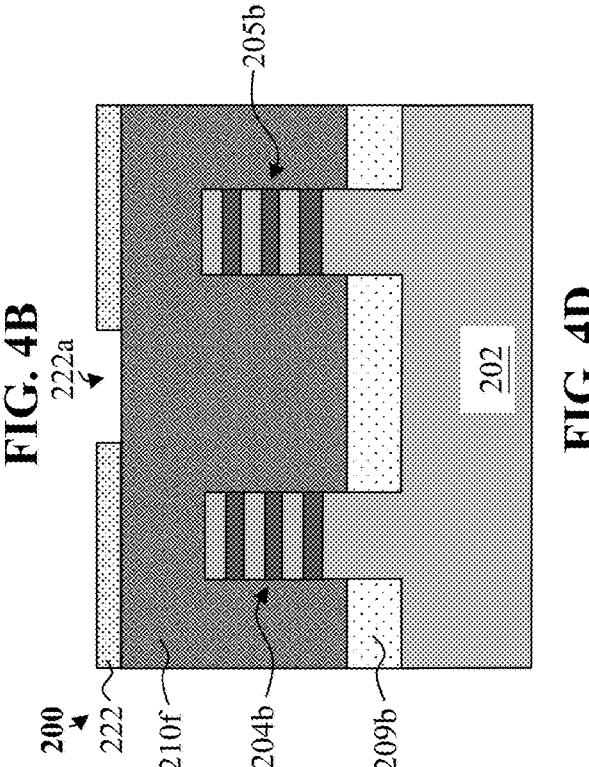
FIG. 4B
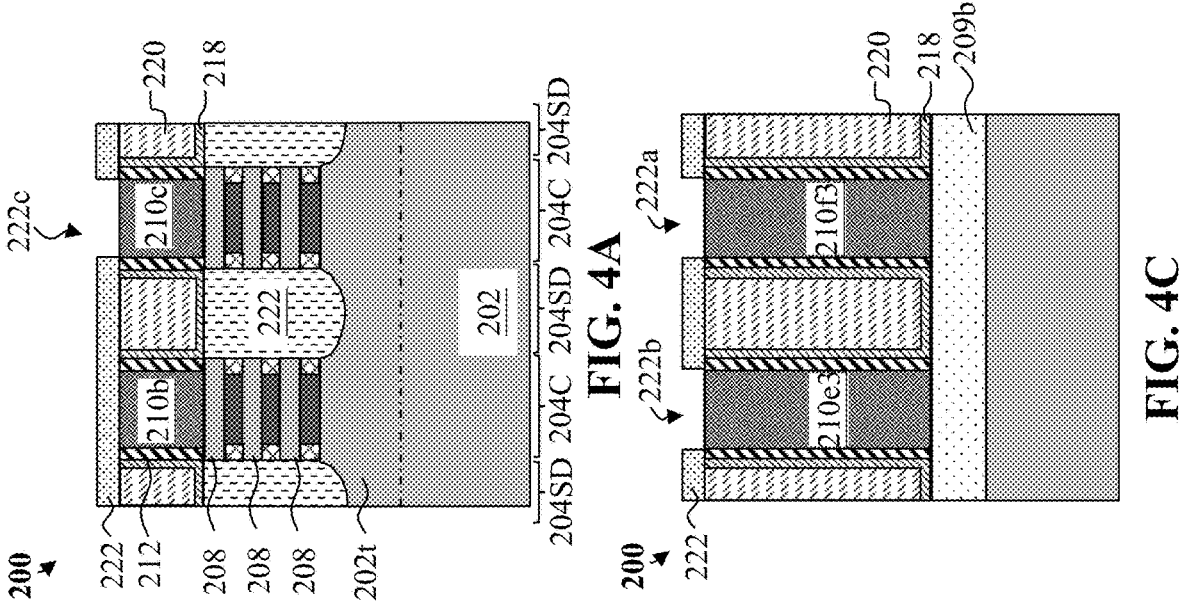
FIG. 4C
FIG. 4D

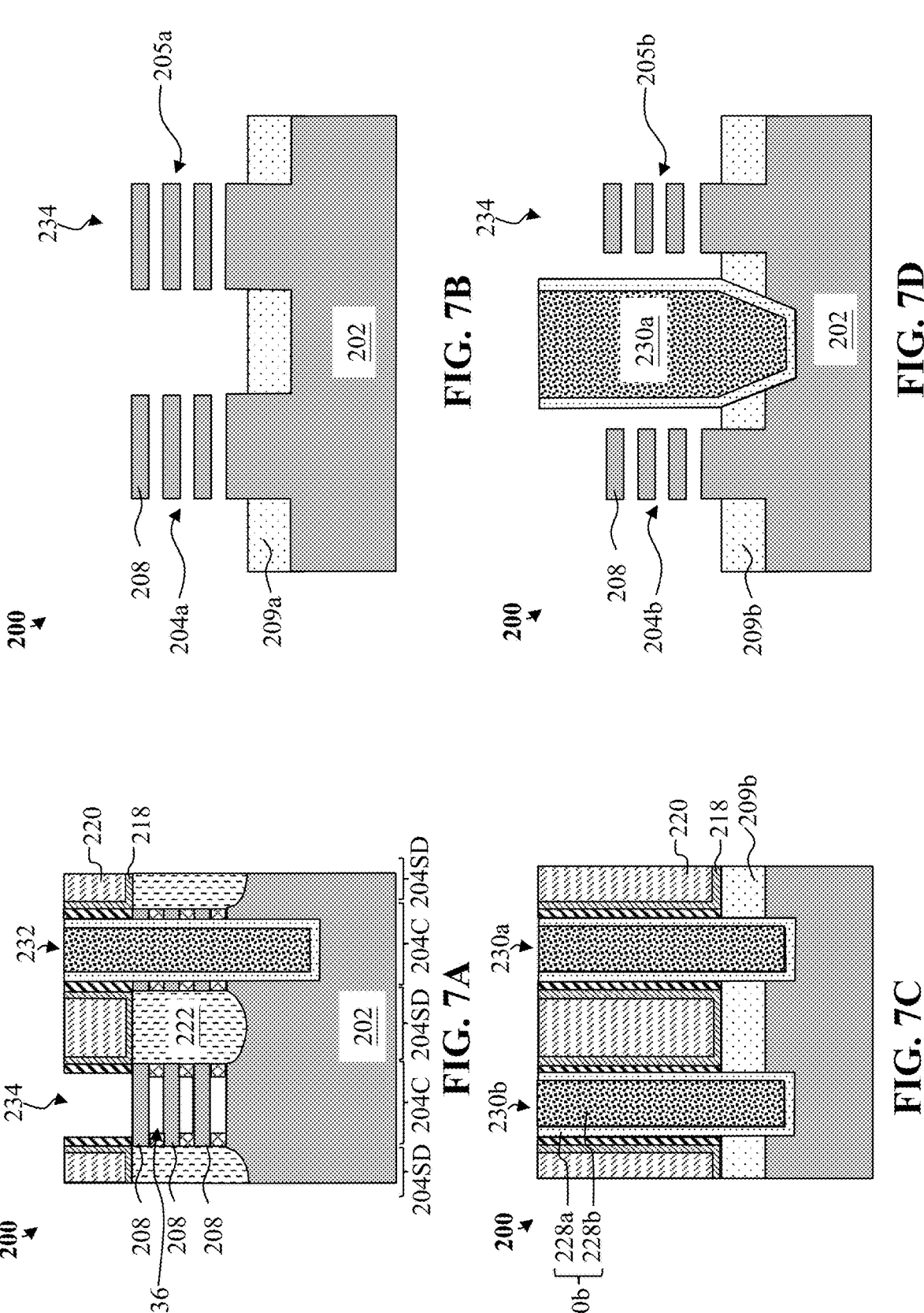

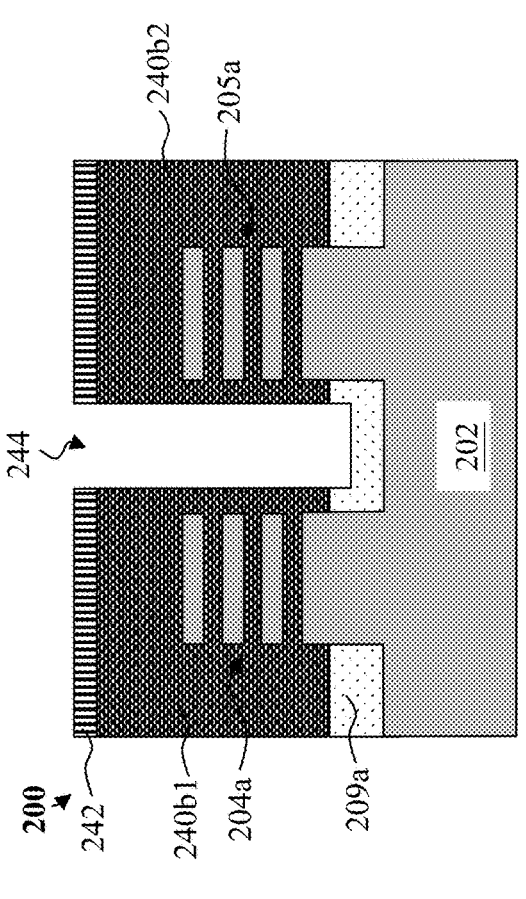
FIG. 10A
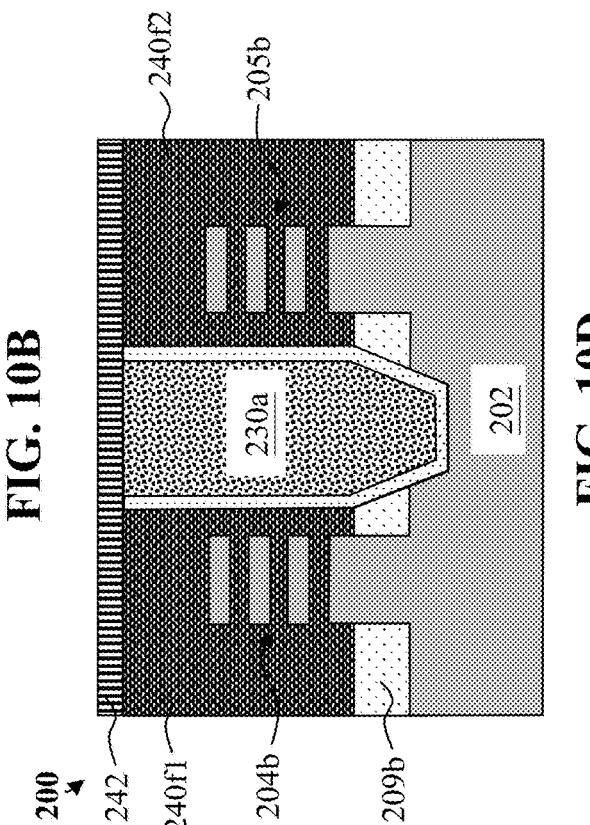
FIG. 10B
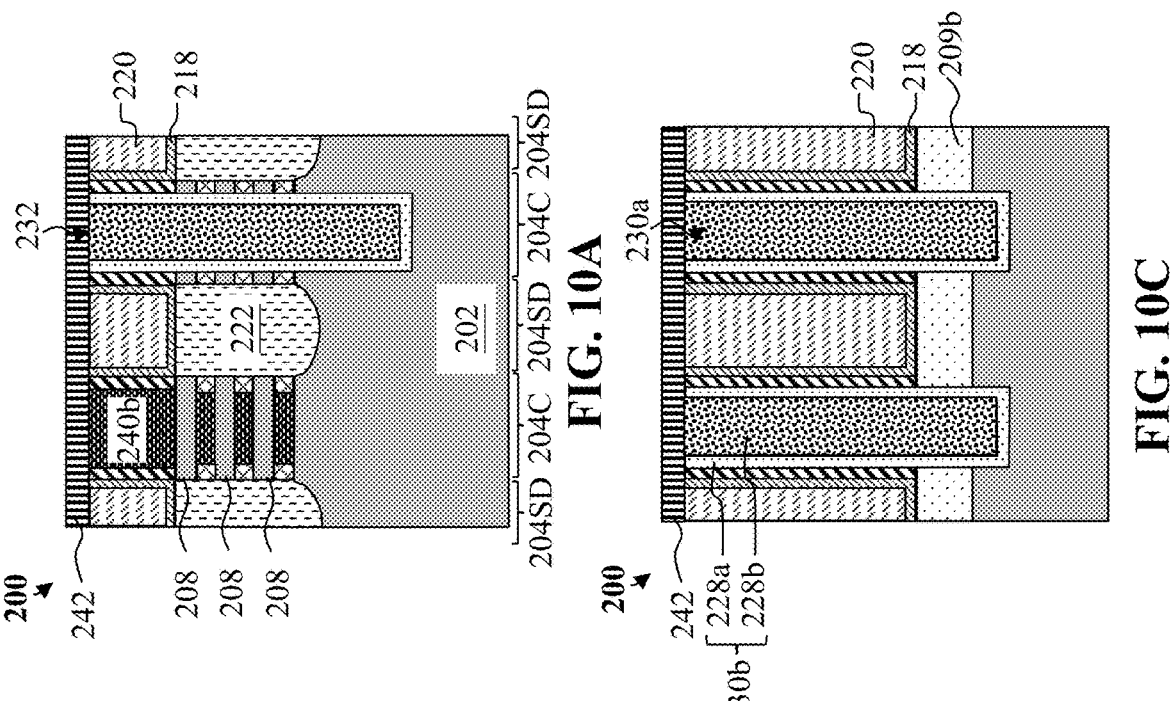
FIG. 10C
FIG. 10D

ISOLATION STRUCTURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, various methods have been developed to form isolation structures to divide one or more gate structure into segments. While existing isolation structures are generally adequate in isolating different segments of the one or more gate structures, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, and 3D illustrate fragmentary cross-sectional views of the workpiece taken along line A-A', line B-B', line C-C', and line D-D' as shown in FIG. 2, respectively, according to various aspects of the disclosure.

FIGS. 4A, 5A, 6A, 7A, 8A, 9A, 10A, and 11A illustrate fragmentary cross-sectional views of the workpiece taken along line A-A' during a fabrication process according to the method of FIG. 1, according to various aspects of the disclosure.

FIGS. 4B, 5B, 6B, 7B, 8B, 9B, 10B, and 11B illustrate fragmentary cross-sectional views of the workpiece taken along line B-B' during the fabrication process according to the method of FIG. 1, according to various aspects of the disclosure.

FIGS. 4C, 5C, 6C, 7C, 8C, 9C, 10C, and 11C illustrate fragmentary cross-sectional views of the workpiece taken along line C-C' during the fabrication process according to the method of FIG. 1, according to various aspects of the disclosure.

FIGS. 4D, 5D, 6D, 7D, 8D, 9D, 10D, and 11D illustrate fragmentary cross-sectional views of the workpiece taken along line D-D' during the fabrication process according to the method of FIG. 1, according to various aspects of the disclosure.

DETAILED DESCRIPTION

Figure 1:
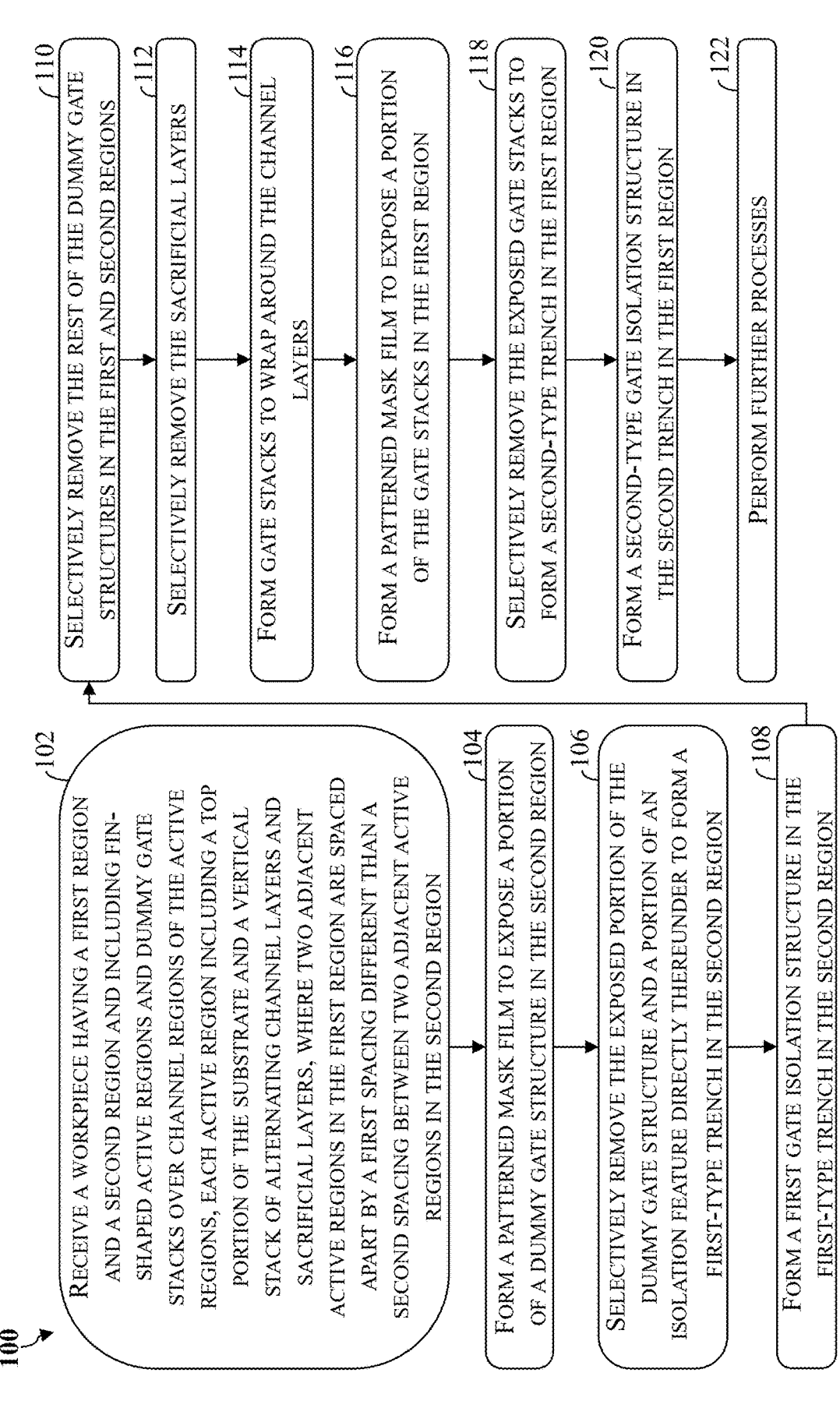
FIG. 1 illustrates a flowchart of an exemplary method for fabricating a semiconductor device, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In the design of integrated circuits (IC), standard (STD) cells with certain functions may be repeatedly used. Accordingly, those standard cells are predesigned and packed in a cell library. The cell library is provided to the IC designers for their particular designing. During integrated circuit designing, the standard cells are retrieved from the cell libraries and placed into desired locations, thus reducing the design effort. Routing is then performed to connect the standard cells and other circuit blocks to form the desired integrated circuit. Pre-defined design rules are followed when placing the standard cells into the desired locations. It is oftentimes desirable to provide design flexibility and to achieve specific target performance at reduced length scales. One such example may be the variation in fin widths across different regions in a STD cell or across two adjacent STD cells. In the present embodiments, fins in a STD cell are configured with different widths to form transistors with different properties. For example, comparing to transistors in a critical path operable to provide high current output for high-speed applications, fins of transistors in a non-critical path may be narrowed to reduce power consumption. In the present disclosure, a critical path is the place that mainly dominates the circuit speed (or signal distribution speed) that is dependent on different circuit applications. If the circuit speed is varied with transistors' performance significantly, then the signal path will be referred to as critical path. Different device dimensions, such as different fin widths of the transistors in the critical paths and non-critical paths provides benefits. However, new problems emerge. For example, to fulfill desired circuit functions, a gate isolation structure may be formed to cut one or more gate structures into segments. To reduce pattern loading, the gate isolation structure may have a uniform width. However, when a gate isolation structure having a uniform width is used to cut gate structures in the critical path and gate structures non-critical path, the distance between the gate isolation structure and the narrower fins is greater than the distance between the gate isolation structure and the wider fins. The increased distance between the gate isolation structure and the narrower fins may induce large parasitic capacitance and degrade circuit speed.

The present disclosure is generally related to semiconductor structures and the fabrication thereof, and more particularly to providing different types of gate isolation structures for transistors in the critical path and transistors in the non-critical path. In the present embodiments, longer gate isolation structures are formed in regions having a larger distance between two fins, thereby reducing the parasitic capacitance without sacrificing the benefits provided by the narrower fin widths. In an exemplary method, after forming a gate structure engaging two fin-shaped active regions, a portion of the gate structure that is formed directly over an isolation feature (e.g., a shallow trench isolation feature) is selectively removed to form an isolation trench. The isolation trench may extend through the isolation feature and extend into the substrate. A gate isolation structure is then formed in the isolation trench. In an embodiment, the gate isolation structure extends lengthwise along a direction that is same to the lengthwise direction of the gate structure. The distances between the gate isolation structure and the two fin-shaped active regions may be reduced, the parasitic capacitance may be thus reduced, and circuit speed may be advantageously improved.

Figure 12:
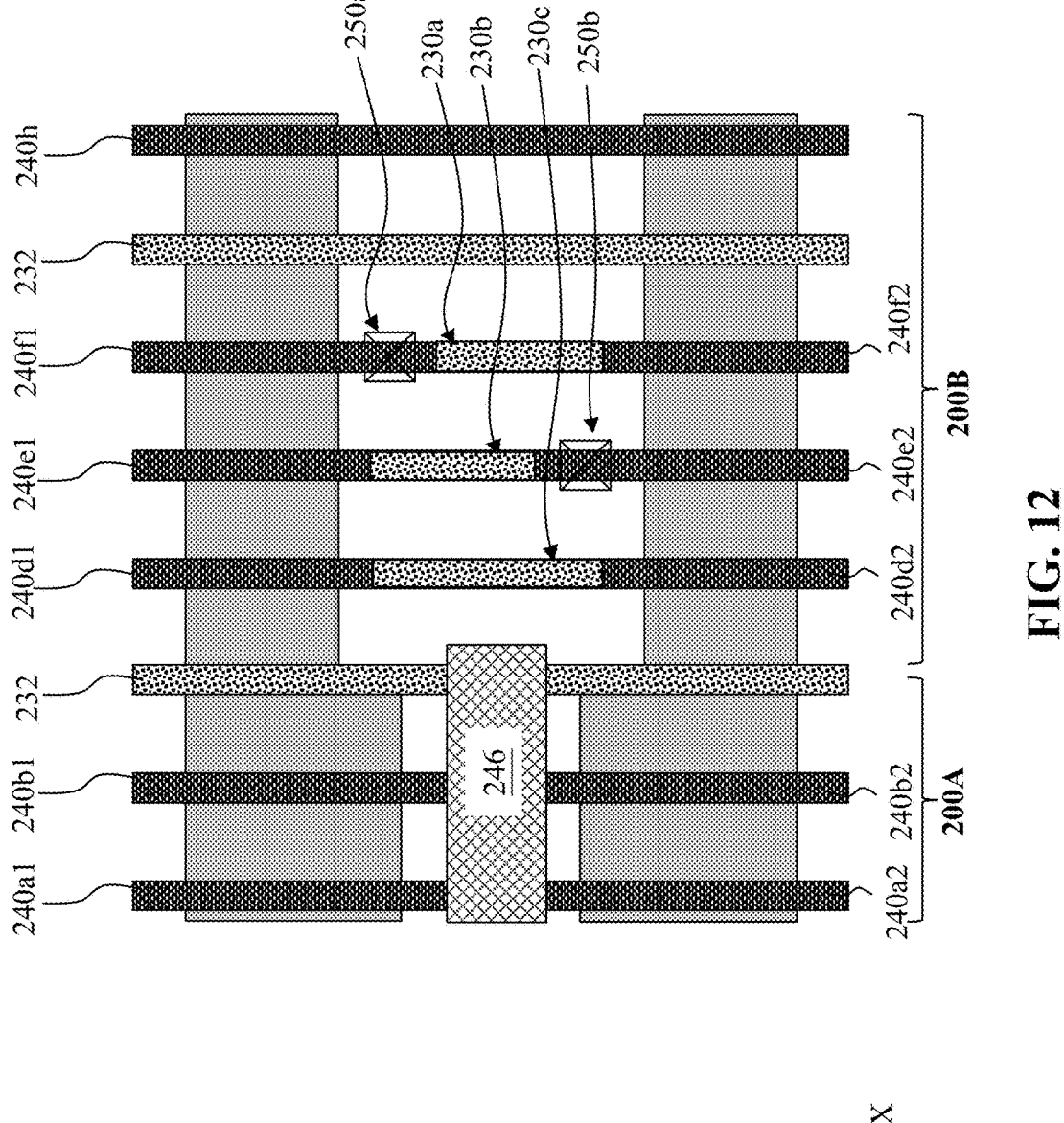
FIG. 12 illustrates a fragmentary top view of a first alternative workpiece, according to various embodiments of the present disclosure.
Figure 13:
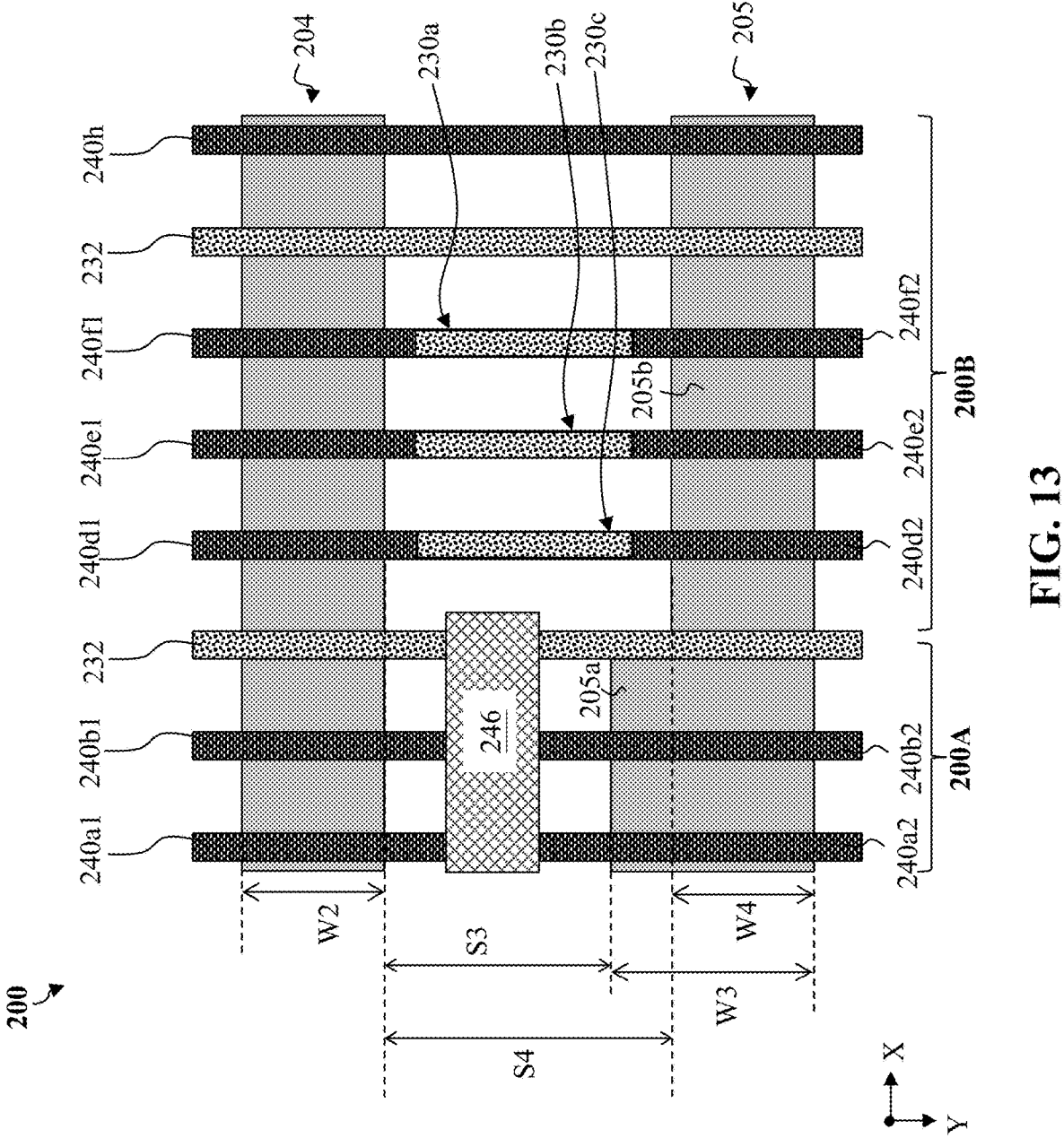
FIG. 13 illustrates a fragmentary top view of a second alternative workpiece, according to various embodiments of the present disclosure.
Figure 14:
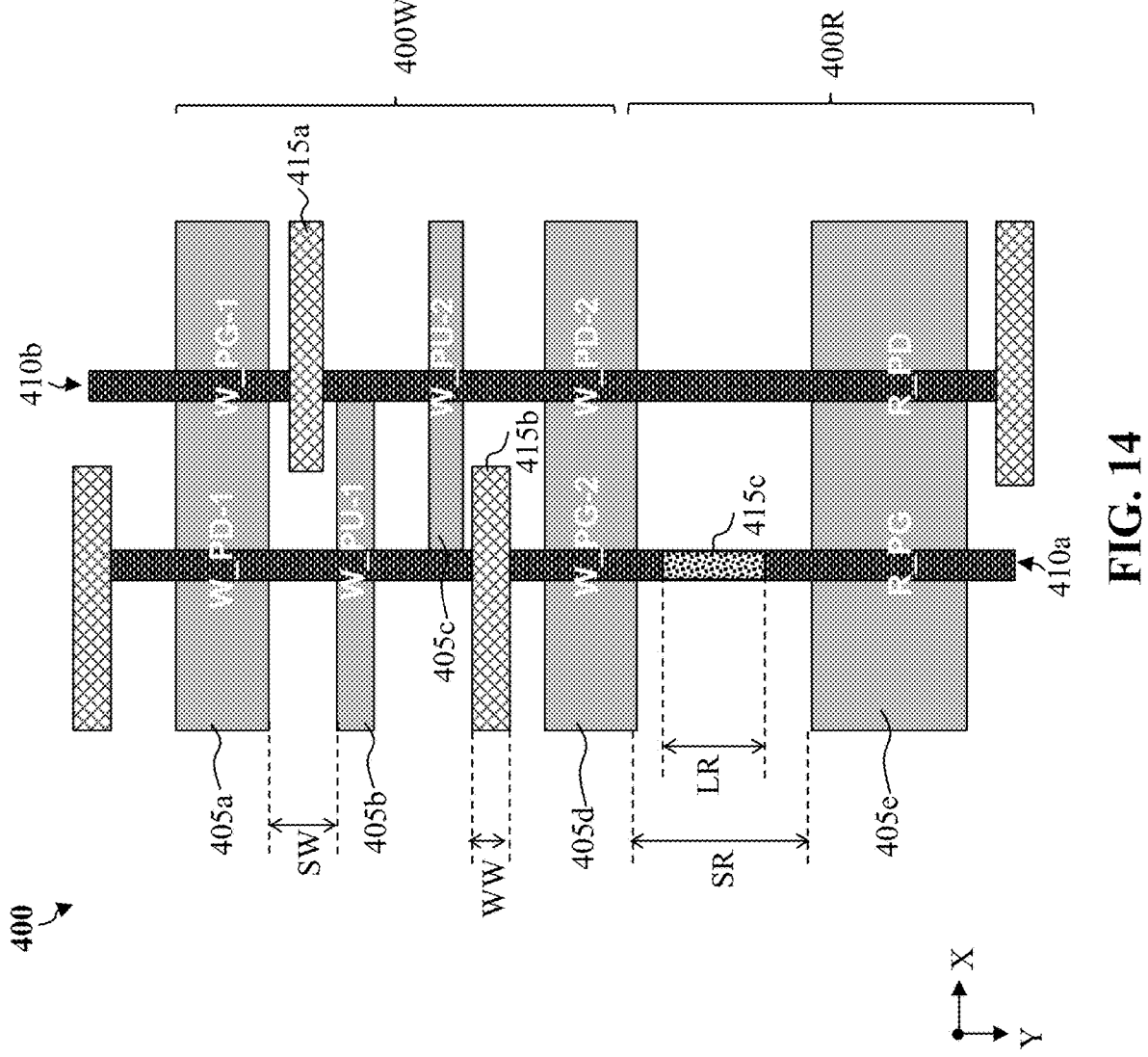
FIG. 14 illustrates a fragmentary top view of another exemplary semiconductor structure, according to various embodiments of the present disclosure.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2, 3A-11A, 3B-11B, 3C-11C, 3D-11D, 4E, 6E, 8E, and 11E, which are fragmentary cross-sectional views and/or top views of a workpiece 200 at different stages of fabrication according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor structure 200 upon conclusion of the fabrication processes, the workpiece 200 may be referred to as the semiconductor structure 200 as the context requires. FIGS. 12, 13, and 14 are fragmentary top views of alternative semiconductor structures. For avoidance of doubts, the X, Y and Z directions in the figures are perpendicular to one another and are used consistently. Throughout the present disclosure, like reference numerals denote like features unless otherwise excepted.

Figure 2:
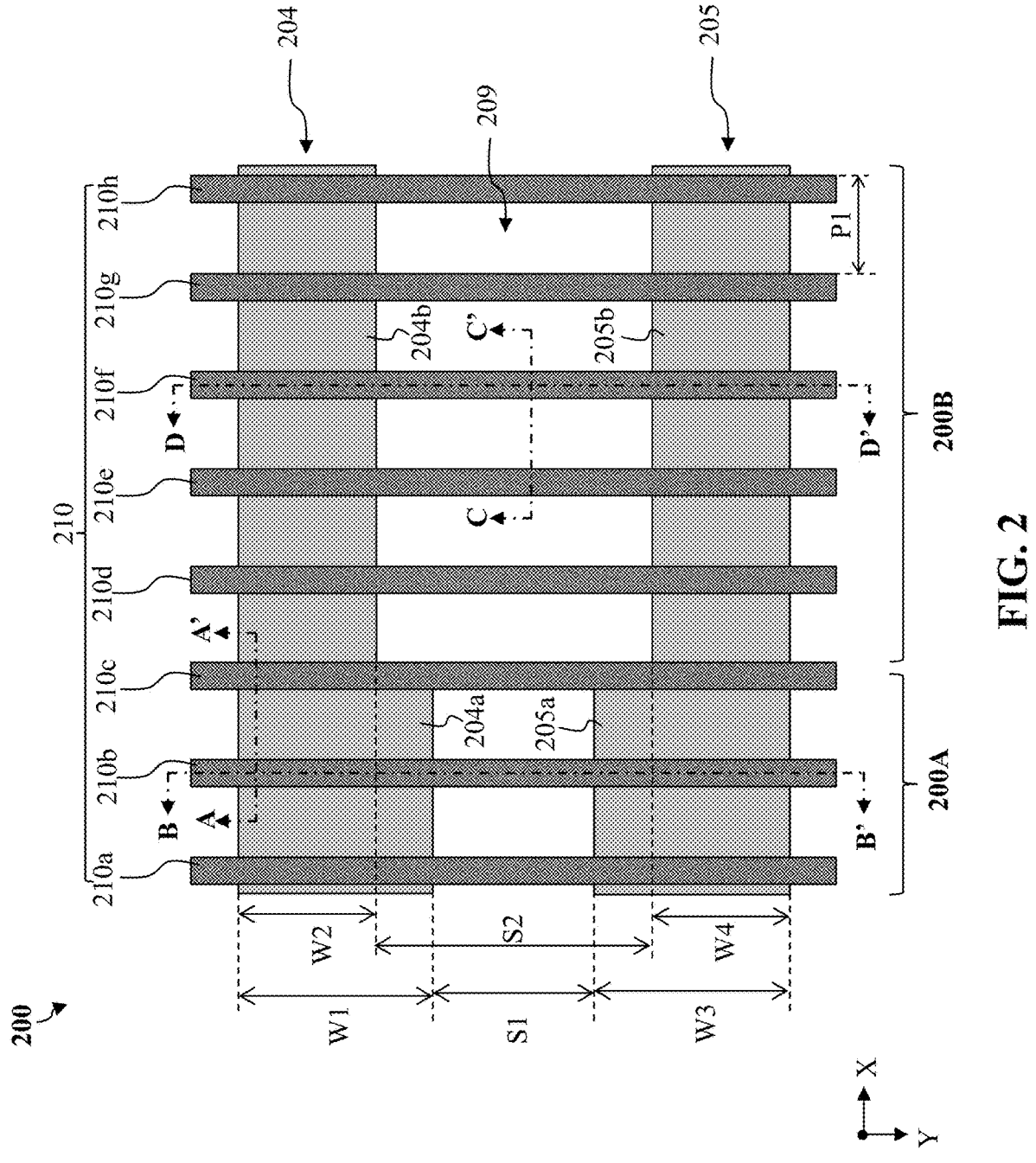
FIG. 2 illustrates a fragmentary top view of an exemplary workpiece to undergo various stages of operations in the methods of FIG. 1, according to various aspects of the disclosure.

Referring to FIGS. 1, 2 and 3A-3D, method 100 includes a block 102 where a workpiece 200 is received. FIG. 2 depicts a fragmentary top view of the workpiece 200 to undergo various stages of operations in the methods of FIG. 1, FIGS. 3A-3D illustrate fragmentary cross-sectional views of the workpiece 200 taken along line A-A', line B-B', line C-C', and line D-D' as shown in FIG. 2, respectively. In the present embodiments, the workpiece 200 includes a first region 200A for forming semiconductor devices (e.g., planar transistors, FinFETs, GAAs) in a critical path and a second region 200B for forming semiconductor devices in a non-critical path.

As depicted in FIGS. 3A-3D, the workpiece 200 includes a substrate 202 (shown in FIGS. 3A-3B). In an embodiment, the substrate 202 is a bulk silicon substrate (i.e., including bulk single-crystalline silicon). The substrate 202 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator. The substrate 202 includes various doped features, such as n-type doped wells, p-type doped wells, and/or other doped features configured to form various devices or components of such devices.

The workpiece 200 also includes multiple fin-shaped active regions (e.g., fin-shaped active regions 204 and 205 shown in FIG. 2) disposed over the substrate 202. Each of the fin-shaped active regions 204 and 205 extends lengthwise along the X direction and includes a first portion 204a/205a in the first region 200A and a second portion 204b/205b in the second region 200B. In the present embodiments, the first portion 204a of the fin-shaped active region 204 has a width W1 along the Y direction, the second portion 204b of the fin-shaped active region 204 has a width W2 along the Y direction, and the width W2 is less than the width W1. The first portion 205a of the fin-shaped active region 205 has a width W3 along the Y direction, the second portion 205b of the fin-shaped active region 205 has a width W4 along the Y direction, and the width W4 is less than the width W3. In an embodiment, the width W1 is equal to the width W3, and the width W2 is equal to the width W4. It is noted that, in embodiment represented in FIG. 2, each of the fin-shaped active regions 204 and 205 is a continuous active region, and its respective first and second portions are portions of the continuous active region. A separation distance S1 between the first portion 204a of the fin-shaped active region 204 and the first portion 205a of the fin-shaped active region 205 is less than a separation distance S2 between the second portion 204b of the fin-shaped active region 204 and the second portion 205b of the fin-shaped active region 205. In the top view depicted in FIG. 2, each of the fin-shaped active regions 204 and 205 resembles an L shape. It is understood that a shape of the top view of the fin-shaped active regions 204 and 205 may have other shapes.

In the present embodiments, the fin-shaped active regions 204 and 205 may be formed from a top portion 202t (shown in FIG. 3A) of the substrate 202 and a vertical stack 207 (shown in FIG. 3A) of alternating semiconductor layers 206 and 208 using a combination of lithography and etch steps. In the depicted embodiment, the vertical stack 207 of alternating semiconductor layers 206 and 208 includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor materials, or combinations thereof, while each sacrificial layer 206 has a composition different from that of the channel layer 208. In an embodiment, the channel layer 208 includes silicon (Si), the sacrificial layer 206 includes silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In some examples, each of the fin-shaped active regions 204 and 205 may include a total of three to ten pairs of alternating sacrificial layers 206 and channel layers 208; of course, other configurations may also be applicable depending upon specific design requirements. In alternative embodiments where fin-type field effect transistors (FinFETs) are desired, the fin-shaped active regions 204 and 205 may include a uniform semiconductor composition along the Z axis and free of the vertical stack 207 as depicted herein. In some embodiments, the fin-shaped active region 204 may be formed over a p-type doped well in the substrate 202, and the fin-shaped active region 205 may be formed over an n-type doped well in the substrate 202. Each of the fin-shaped active regions 204 and 205 is divided into channel regions (e.g., 204C shown in FIG. 3A) and source/drain regions (e.g., 204SD shown in FIG. 3A). In the present disclosure, source/drain regions may refer to a source region or a drain region, individually or collectively dependent upon the context, source/drain features may refer to a source feature or a drain feature, individually or collectively dependent upon the context.

The workpiece 200 also includes an isolation feature 209 (shown in FIG. 3B) formed around the fin-shaped active regions 204 and 205 to isolate two adjacent fin-shaped active regions. The isolation feature 209 may also be referred to as a shallow trench isolation (STI) feature. In some embodiments, the STI feature 209 may include silicon oxide, silicon oxynitride, fluorine-doped silicate glass (FSG), a low-k dielectric, combinations thereof, and/or other suitable materials. In the present embodiment, for ease of description, the portion of the isolation feature 209 formed in the first region 200A may be referred to as an isolation feature 209a, and the portion of the isolation feature 209 formed in the second region 200B may be referred to as an isolation feature 209b.

Still referring to FIGS. 2 and 3A-3D, the workpiece 200 also includes dummy gate structures (e.g., dummy gate structures 210a-210h) disposed over channel regions of the fin-shaped active regions 204 and 205. In some embodiments, the dummy gate structures 210a-210h may share substantially the same composition and dimension and have a gate pitch P1. The channel regions 204C and the dummy gate structures 210a-210h also define source/drain regions 204SD that are not vertically overlapped by the dummy gate structures 210a-210h. Each of the channel regions 204C is disposed between two source/drain regions 204SD along the X direction. In the present embodiments, dummy gate structures 210a-210b are formed in the first region 200A and over channel regions of the first portion 204a/205a of the fin-shaped active regions 204 and 205, dummy gate structures 210d-210h are formed in the second region 200B and over channel regions of the second portion 204b/205b of the fin-shaped active regions 204 and 205, and the dummy gate structure 210c is formed at the boundary of the first region 200A and the second region 200B and engages both the first portion 204a/205a and second portion 204b/205b of the fin-shaped active regions 204 and 205. Multiple dummy gate structures are shown in FIG. 2 but the workpiece 200 may include any other suable number of dummy gate structures. The number of dummy gate structures formed in the first region 200A and the number of dummy gate structures formed in the second region 200B are just an example and are not intended to limit the present disclosure to what is explicitly illustrated therein. In this embodiment, a gate replacement process (or gate-last process) is adopted where some of the dummy gate structures 210a-210h serve as placeholders for functional gate structures. Other processes for forming the functional gate structures are possible. In the present embodiments, although not separately labeled, each of the dummy gate structures 210a-210h includes a dielectric layer (e.g., silicon oxide) and a dummy gate electrode (e.g., polysilicon) disposed over the dielectric layer. The dummy gate structures 210a-210h may be separately or collectively referred to as a dummy gate structure 210.

As depicted in FIG. 3B, the dummy gate structure 210b includes a first portion 210b1 disposed directly over the first portion 204a of the fin-shaped active region 204, a second portion 210b2 disposed directly over the first portion 205a of the fin-shaped active region 205, and a third portion 210b3 disposed directly over the isolation feature 209a and between the first portion 210b1 and second portion 210b2. As depicted in FIG. 3D, the dummy gate structure 210f includes a first portion 210f1 disposed directly over the second portion 204b of the fin-shaped active region 204, a second portion 210f2 disposed directly over the second portion 205b of the fin-shaped active region 205, and a third portion 210f3 disposed directly over the isolation feature 209b and between the first portion 210f1 and second portion 210f2. Other dummy gate structures may have similar configurations. As will be described in detail below, the dummy gate structure 210f would be cut into pieces by a first-type gate isolation structure (e.g., the first-type gate isolation structure 230a) different than the second-type gate isolation structure. At least a portion of the dummy gate structures 210a-210h are configured to be replaced with a functional gate stack (e.g., gate stack 240f1). The dummy gate structure 210b would be replaced by a gate stack 240b and then cut into pieces by a second-type gate isolation structure (e.g., the second-type gate isolation structure 246).

Still referring to FIG. 3A, the workpiece 200 also includes gate spacers 212 extending along sidewalls of the dummy gate structures 210. In some embodiments, the gate spacers 212 may include silicon oxide, silicon oxycarbide, silicon carbonitride, silicon nitride, zirconium oxide, aluminum oxide, or a suitable dielectric material. The gate spacers 212 may be a single-layer structure or a multi-layer structure. Additionally, the workpiece 200 also includes inner spacer features 214 disposed between the two adjacent channel layers 208 and in direct contact with sacrificial layers 206 in the channel regions 204C. The inner spacer features 214 may include silicon nitride, silicon oxycarbonitride, silicon carbonitride, silicon oxide, silicon oxycarbide, silicon carbide, or silicon oxynitride.

As shown in FIG. 3A, the workpiece 200 also includes source/drain features 216 formed in and/or over source/drain regions 204SD and coupled to the channel layers 208 in the channel regions 204C. The source/drain features 216 are spaced apart from the sacrificial layers 206 by the inner spacer features 214. Depending on the conductivity type of the to-be-formed transistor, the source/drain features 216 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Still referring to FIGS. 1, 3A, and 3C, the workpiece 200 also includes a contact etch stop layer (CESL) 218 and an interlayer dielectric (ILD) layer 220 deposited over the substrate 202 and adjacent to the dummy gate structures 210. The CESL 218 is configured to protect the various underlying components during subsequent fabrication processes and may include silicon nitride, silicon oxynitride, and/or other suitable materials and may be formed by ALD, chemical vapor deposition (CVD), plasma-enhanced chemical vapor deposition (PECVD) process and/or other suitable deposition or oxidation processes. As shown in FIGS. 3A and 3C, the CESL 218 is disposed on top surfaces of the source/drain features 216 and sidewalls of the gate spacers 212. The ILD layer 220 may be deposited by a CVD process, a PECVD process or other suitable deposition technique over the workpiece 200 after the deposition of the CESL 218. The ILD layer 220 may include silicon oxide, a low-k dielectric material, TEOS, doped silicon oxide (e.g., BPSG, FSG, PSG, BSG, etc.), other suitable dielectric materials, or combinations thereof.

Referring to FIGS. 1, 2 and 4A-4E, method 100 includes a block 104 where a patterned mask film 222 is formed over the workpiece 200 and exposes a portion of the dummy gate structures 210 in the second region 200B. A mask film 222 may be deposited over the workpiece 200. The mask film 222 may include aluminum oxide, silicon oxide, silicon nitride, silicon carbonitride, silicon oxycarbide, silicon oxynitride, silicon oxycarbonitride, other suitable materials, or combinations thereof, and may be formed by chemical vapor deposition (CVD), atomic layer deposition (ALD), physical vapor deposition (PVD), other suitable methods, or combinations thereof. The mask film 222 is patterned to form one or more openings exposing determined portions of some of the dummy gate structures. The patterning of the mask film 222 may include multiple processes. For example, a masking element including a photoresist layer may be formed over the mask film 222, exposed to a radiation source through a patterned mask, and subsequently developed to form a patterned masking element. The mask film 222 may then be etched using the patterned masking element as an etch mask to form the openings exposing, for example, some portions of the dummy gate structures while not exposing other dummy gate structures.

Figure 4E:
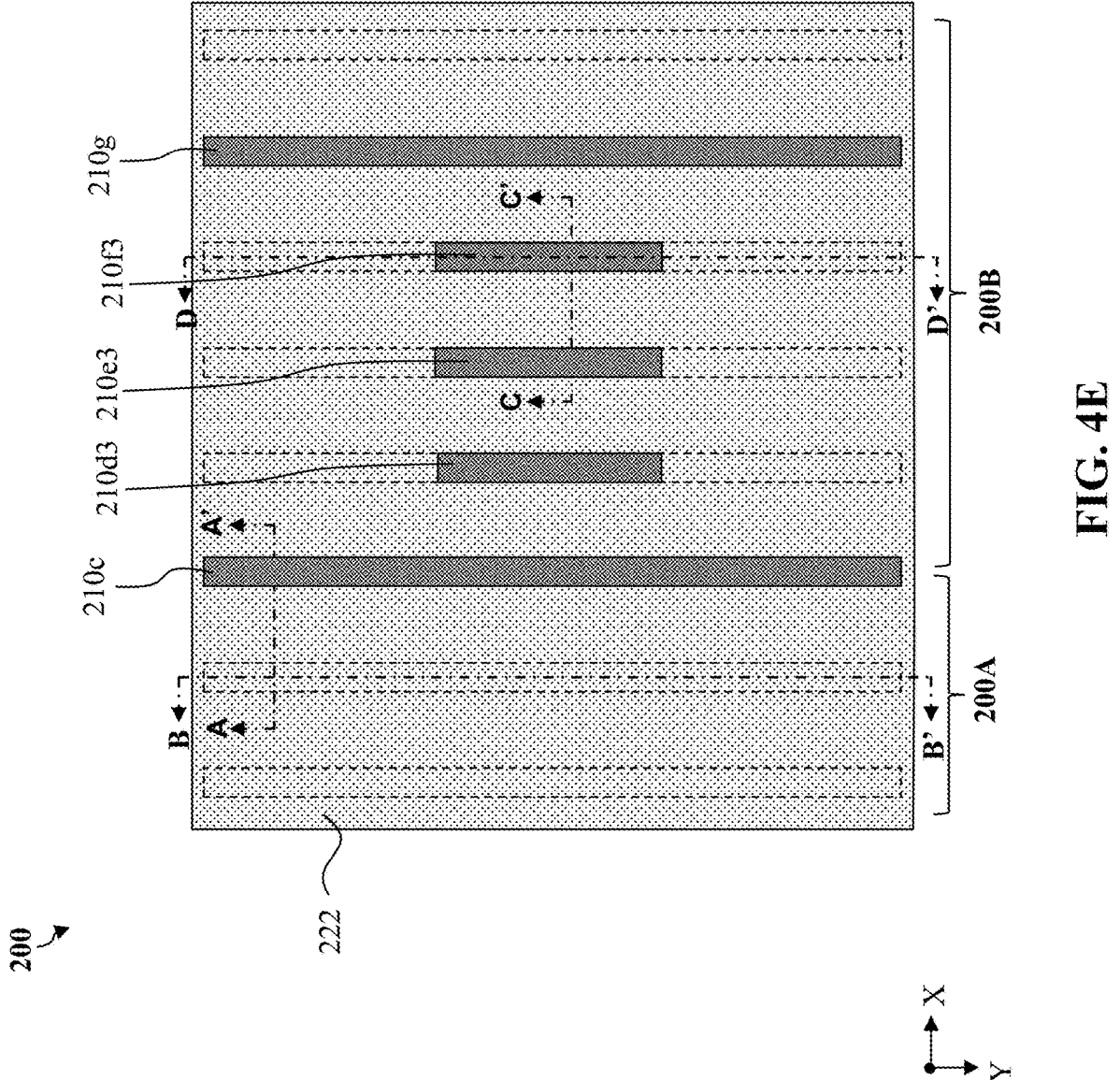
FIGS. 4E, 6E, 8E, and 11E illustrate fragmentary top views of the exemplary workpiece shown in FIGS. 4A-4D, 6A-6D, 8A-8D, 11A-11D, respectively, according to various embodiments of the present disclosure.

FIG. 4E depicts a fragmentary top view of the workpiece 200 shown in FIGS. 4A-4D.

In the present embodiments, the patterned mask film 222 includes a first opening 222a (shown in FIGS. 4C-4D) exposing the third portion 210f/3 of the dummy gate structure 210f. The patterned mask film 222 also includes a second opening 222b (shown in FIG. 4C) exposing a portion 210e3 of the dummy gate structure 210e formed directly over the isolation feature 209b. To cut the dummy gate structures 210d-210f in the second region 200B into pieces, the patterned mask film 222 may also include another opening (not shown) configured to expose a portion 210d3 (shown in FIG. 4E) of the dummy gate structure 210d formed directly over the isolation feature 209b. The number and locations of the openings of the patterned mask film 222 may be determined according to a desired circuit function in the second region 200B. In the present embodiment, the openings (e.g., openings 222a-222b) that expose the third portions 210d3, 210e3, and 210f/3 of the dummy gate structures 210d. 210e, and 210f extend lengthwise along the Y direction and have substantially same lengths.

Cut poly on oxide definition edge (CPODE) processes have been developed to form isolation structures (may be referred to as CPODE structures or dielectric gates) to divide active regions into segments. In some embodiments, CPODE structures are implemented to divide the fin-shaped active regions 205 and 205 into segments. For example, a first CPODE structure may replace the dummy gate structure 210c and a second CPODE structure may replace the dummy gate structure 210g, thereby cutting each of the fin-shaped active regions 204 and 205 into three segments. To simplify fabrication processes for forming the CPODE structures, as depicted in FIG. 4E, the patterned mask film 222 may also include a third opening 222c exposing the dummy gate structure 210c in its entirety along the Y direction and a fourth opening exposing the dummy gate structure 210g in its entirety along the Y direction. The rest of the dummy gate structures and dielectric layers in the workpiece 200 may be covered by the patterned mask film 222. Although three dummy gate structures are partially exposed and two dummy gate structures are entirely exposed by the patterned mask film 222 in the present embodiment, it is understood that, to fulfill different circuit functions, the number and locations of the openings of the patterned mask film 222 may be adjusted accordingly.

Referring to FIGS. 1, 2 and 5A-5D, method 100 includes a block 106 where an etching process is performed to selectively remove the exposed portions 210d3, 210e3, and 210f/3 of the dummy gate structures 210d, 210e, and 210f and a portion of the isolation feature 209b thereunder to form first-type gate isolation trenches in the second region 200B. While using the patterned mask film 222 as an etch mask, the etching process is performed to selectively remove the exposed portions 210d3, 210e3, and 210f/3 of the dummy gate structures 210d, 210e, and 210f without substantially removing the gate spacers 212. The etching process also selectively removes the portions of the isolation features 209b disposed directly under the exposed portions 210d3, 210e3, and 210f/3 of the dummy gate structures 210d, 210e, and 210f, thereby forming the first-type gate isolation trenches (e.g., first-type gate isolation trenches 224a and 224b shown in FIGS. 5C-5D) in the second region 200B.

Figures 5A, 5B, 5C, 5D:
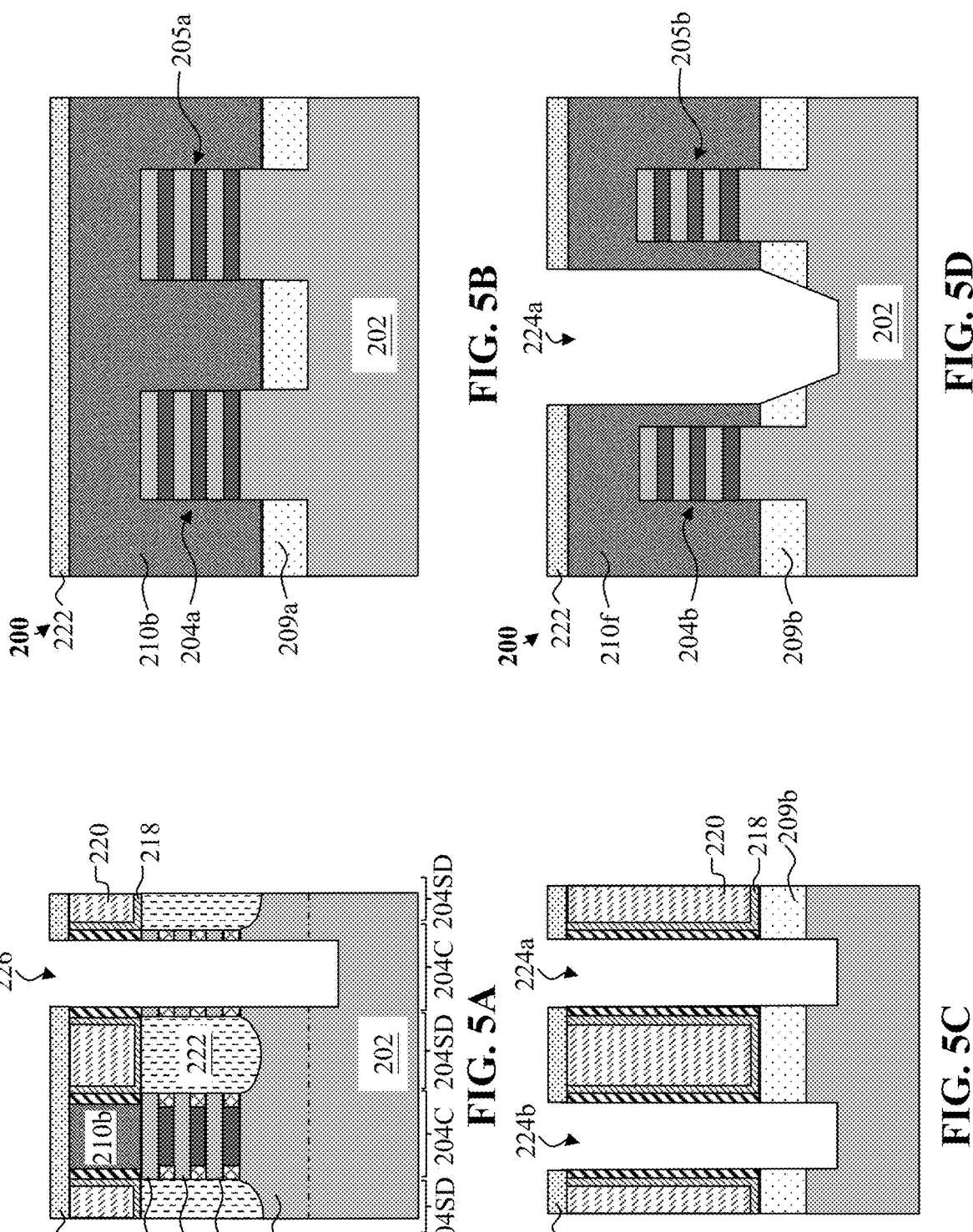

The etching process further selectively removes the exposed dummy gate structures 210c and 210g, portions of fin-shaped active region 204-205b disposed directly under the dummy gate structures 210c and 210g, and portions of the isolation features 209 disposed directly under the dummy gate structures 210c and 210g to form CPODE trenches (e.g., CPODE trench 226 shown in FIG. 5A). The CPODE trenches 226 are formed along with the first-type gate isolation trenches 224a and 224b. In some embodiments, the CPODE trench 226 and the first-type gate isolation trenches 224a and 224b both extend through the STI feature 209 and extend into the substrate 202. The CPODE trench 226 and the first-type gate isolation trenches 224a and 224b may be tapered trenches. In an embodiment, a depth of the first-type gate isolation trenches 224a and 224b is equal to a depth of the CPODE trench 226. The patterned mask film 222 may be selectively removed after the forming of the first-type gate isolation trenches and the CPODE trenches.

Figures 6A, 6B, 6C, 6D:
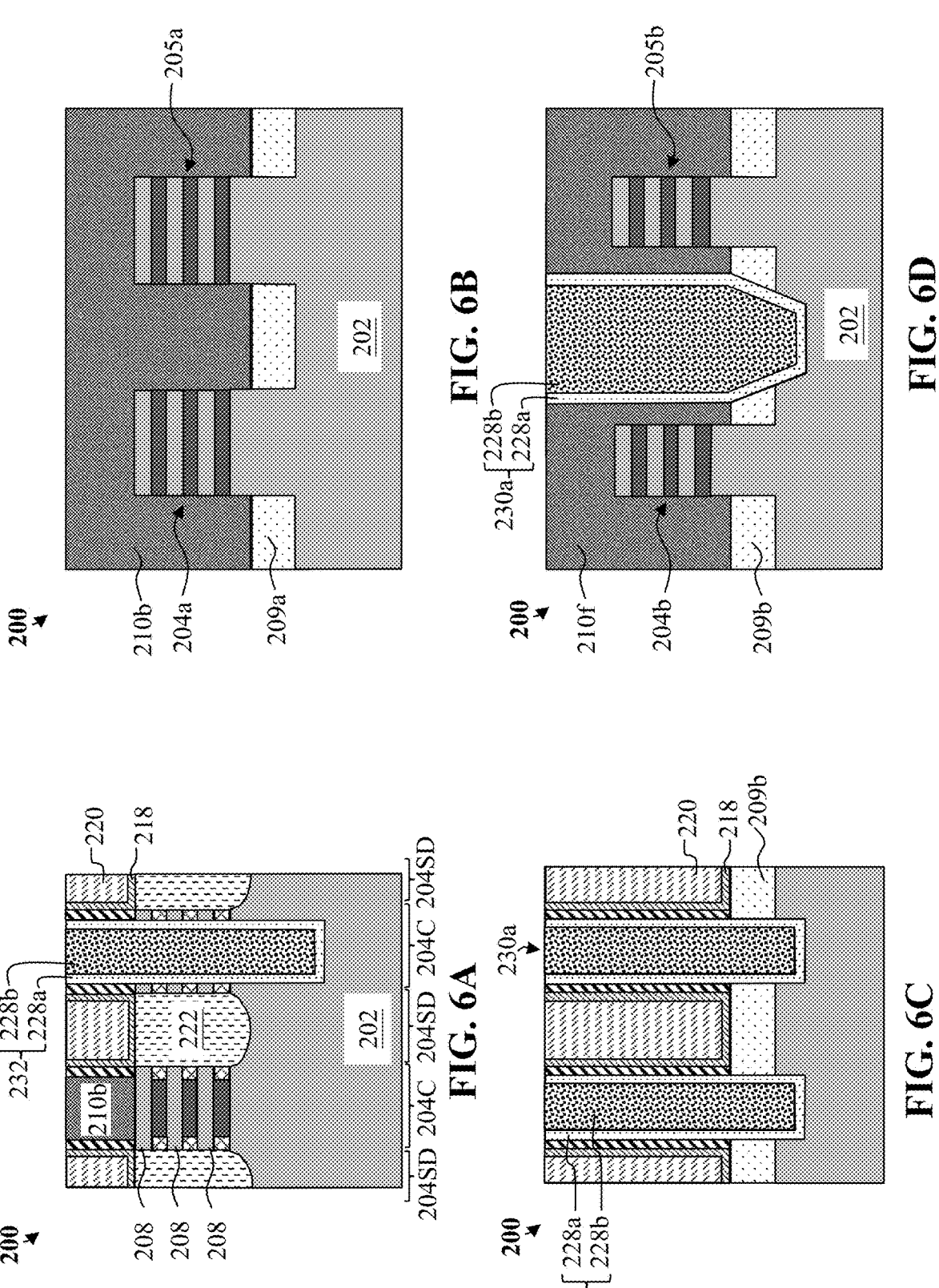
Figure 6E:
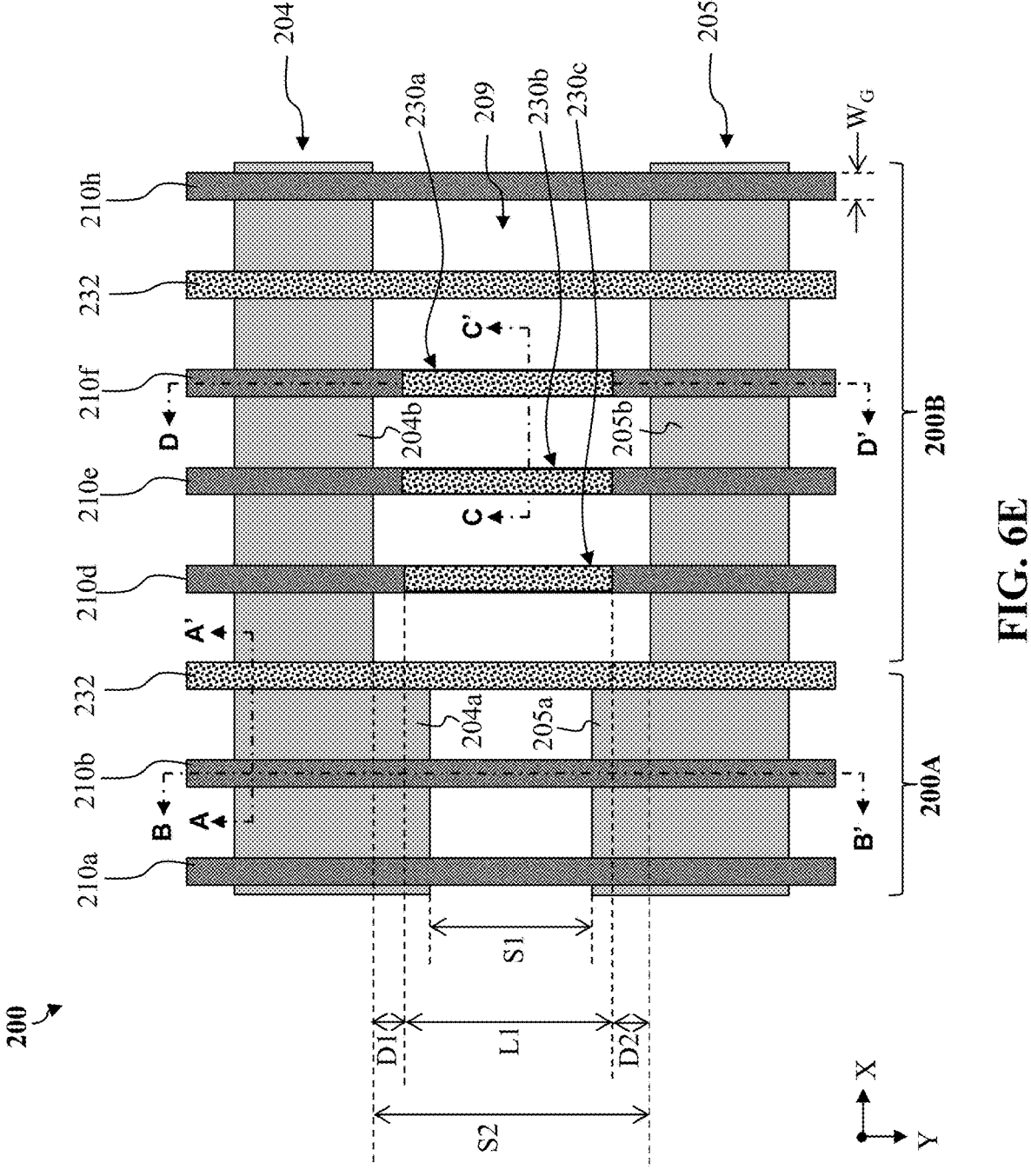

Referring to FIGS. 1, 2 and 6A-6E, method 100 includes a block 108 where first-type gate isolation structures are formed in the first-type gate isolation trenches 224a and 224b in the second region 200B. FIG. 6E depicts a fragmentary top view of the workpiece 200 shown in FIGS. 6A-6D. After forming the first-type gate isolation trenches (e.g., the first-type gate isolation trenches 224a and 224b), a first dielectric layer 228a is deposited over the workpiece 200 and partially fills the first-type gate isolation trenches. In an embodiment, the first dielectric layer 228a is conformally deposited to have a generally uniform thickness over the top surface of the workpiece 200 and partially fills the first-type gate isolation trenches 224a and 224b. The first dielectric layer 228a may be formed by performing a deposition process such as a CVD process, a PVD process, an ALD process, or other suitable deposition process. In some embodiments, the first dielectric layer 228a may include silicon oxide, silicon oxynitride, fluorine-doped silicate glass (FSG), a low-k dielectric, combinations thereof, and/or other suitable materials. In an embodiment, the first dielectric layer 228a includes silicon oxide.

Still referring to FIGS. 6A-6E, after forming the first dielectric layer 228a, a second dielectric layer 228b is formed on the first dielectric layer 228a to fill remaining portions of the first-type gate isolation trenches (e.g., the first-type gate isolation trenches 224a and 224b). In some embodiments, the second dielectric layer 228b may include silicon nitride, silicon oxycarbonitride, silicon carbonitride, silicon oxynitride, other suitable materials, or combinations thereof. In an embodiment, the second dielectric layer 228b includes silicon nitride. In the present embodiments, the first dielectric layer 228a and the second dielectric layer 228b are further deposited in the CPODE trenches (e.g., the CPODE trench 226). A planarization process (e.g., chemical mechanical planarization) (CMP) is then performed to remove excess portions of the first and second dielectric layers 228a and 228b. In the present embodiment, the planarization process stops when top surfaces of the dummy gate structures 210 are exposed. The planarization process defines final structures of first-type gate isolation structures (e.g., first-type gate isolation structures 230a-230c shown in FIG. 6E) formed in the first-type gate isolation trenches and CPODE structures (e.g., CPODE structures 232 shown in FIG. 6E) formed in the CPODE trenches. That is, the CPODE structures 232 and the first-type gate isolation structures 230a-230c have the same composition and are formed simultaneously. In the embodiments represented in FIGS. 6A-6E, each of the first-type gate isolation structures 230a-230c and the CPODE structures 232 is a multi-layer (e.g., dual-layer) structure. In an alternative embodiments, each of the first-type gate isolation structures 230a-230c and the CPODE structures 232 may be a single layer structure and is formed of one dielectric layer.

As depicted in FIG. 6E, each of the first-type gate isolation structures 230a-230c extends lengthwise along the Y direction. That is, the first-type gate isolation structures 230a-230c and the dummy gate structures 210 (e.g., dummy gate structures 210a-210b and remaining portions of the dummy gate structures 210d-210f) extend lengthwise along the same direction. The first-type gate isolation structures 230a-230c may have a same length L1. In some embodiments, the length L1 is equal to or greater than the separation distance S1. In some embodiments, the length L1 is equal to or less than the separation distance S2. The length L1 is less than a length of the CPODE structure 232. A distance D1 between the first-type gate isolation structures 230a-230c and the second portion 204b of the fin-shaped active region 204 may be equal to or different than a distance D2 between the first-type gate isolation structures 230a-230c and the second portion 205b of the fin-shaped active region 205. In some embodiments, along the X direction, a width of each of the first-type gate isolation structures 230a-230c may be equal to a width WG of the dummy gate structure (e.g., the dummy gate structure 210f). Since the dummy gates structures (will be replaced by functional gate stacks) in the second region 200B have reduced portions formed directly over the isolation features, an overlap area between the dummy gate structures and adjacent conductive features (e.g., source/drain contacts) will be reduced, and a parasitic capacitance may be advantageously reduced. It is understood that the concept of forming the first-type gate isolation structure in the second region 200B that having a greater separation distance S2 between two adjacent active regions may be implemented to other standard cells with different layouts. In embodiments represented in FIG. 6E, in a top view, an entirety of the first-type gate isolation structure 230c is disposed directly over the isolation feature 209.

Referring to FIGS. 1, 2 and 7A-7D, method 100 includes a block 110 where the dummy gate structures 210 in the first region 200A and second region 200B are selectively removed to form first gate openings 234. An etching process may be performed to selectively remove the dummy gate structures 210a-210b and 210h and remaining portions of the dummy gate structures 210d-210f without substantially etching the first-type gate isolation structures 230a-230c and the CPODE structures 232. The removal of the dummy gate structures 210a-210b and 210h and remaining portions of the dummy gate structures 210d-210f forms the first gate openings 234.

Still referring to FIGS. 1, 2 and 7A-7D, method 100 includes a block 112 where the sacrificial layers 206 in the first region 200A and second region 200B are selectively removed to form second gate openings 236. After the removal of the dummy gate structures 210, another etching process is performed to selectively remove the sacrificial layers 206 without substantially etching the channel layers 208 to release the channel layers 208 as channel members 208. The removal of the sacrificial layers 206 forms the second gate openings 236.

Referring to FIGS. 1, 2 and 8A-8E, method 100 includes a block 114 where gate stacks are formed in the first and second gate openings 234 and 236. More specifically, the dummy gate structures 210a, 210b and 210h are replaced by the gate stacks 240a. 240b, and 240h, respectively, and remaining portions of the dummy gate structures 210d, 210e and 210f are replaced by the gate stacks 240d, 240c, and 240f, respectively. After releasing the channel layers 208 as channel members 208, the gate stacks (e.g., gate stacks 240a, 240b, 240d, 240c, 240f, 240h) are formed over the workpiece 200 to wrap around and over each of the channel members 208. In the present embodiments, each of the gate stacks may include an interfacial layer (not explicitly shown), a gate dielectric layer (not explicitly shown) over the interfacial layer, and a gate electrode layer (not explicitly shown) over the gate dielectric layer. In some embodiments, the interfacial layer may include silicon oxide. The gate dielectric layer is then deposited over the interfacial layer using ALD, CVD, and/or other suitable methods. The gate dielectric layer may include high-K dielectric materials such as hafnium oxide, titanium oxide ($TiO_2$), hafnium zirconium oxide (HfZrO), tantalum oxide ($Ta_2O_5$), hafnium silicon oxide (HfSiO4), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a planarization process, such as a CMP process, may be performed to remove excess materials over the ILD layer 220.

Figures 8A, 8B, 8C, 8D:
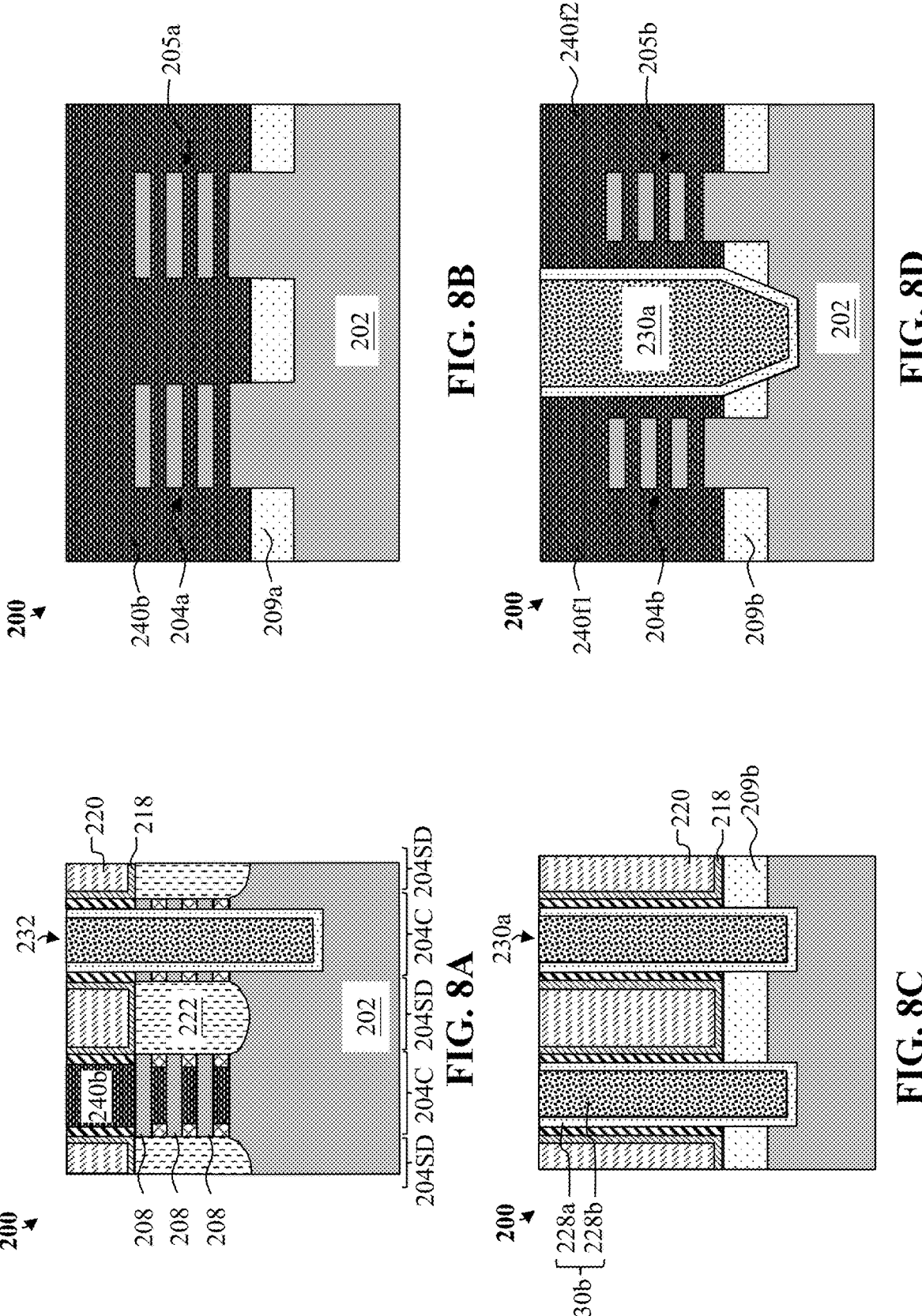
Figure 8E:
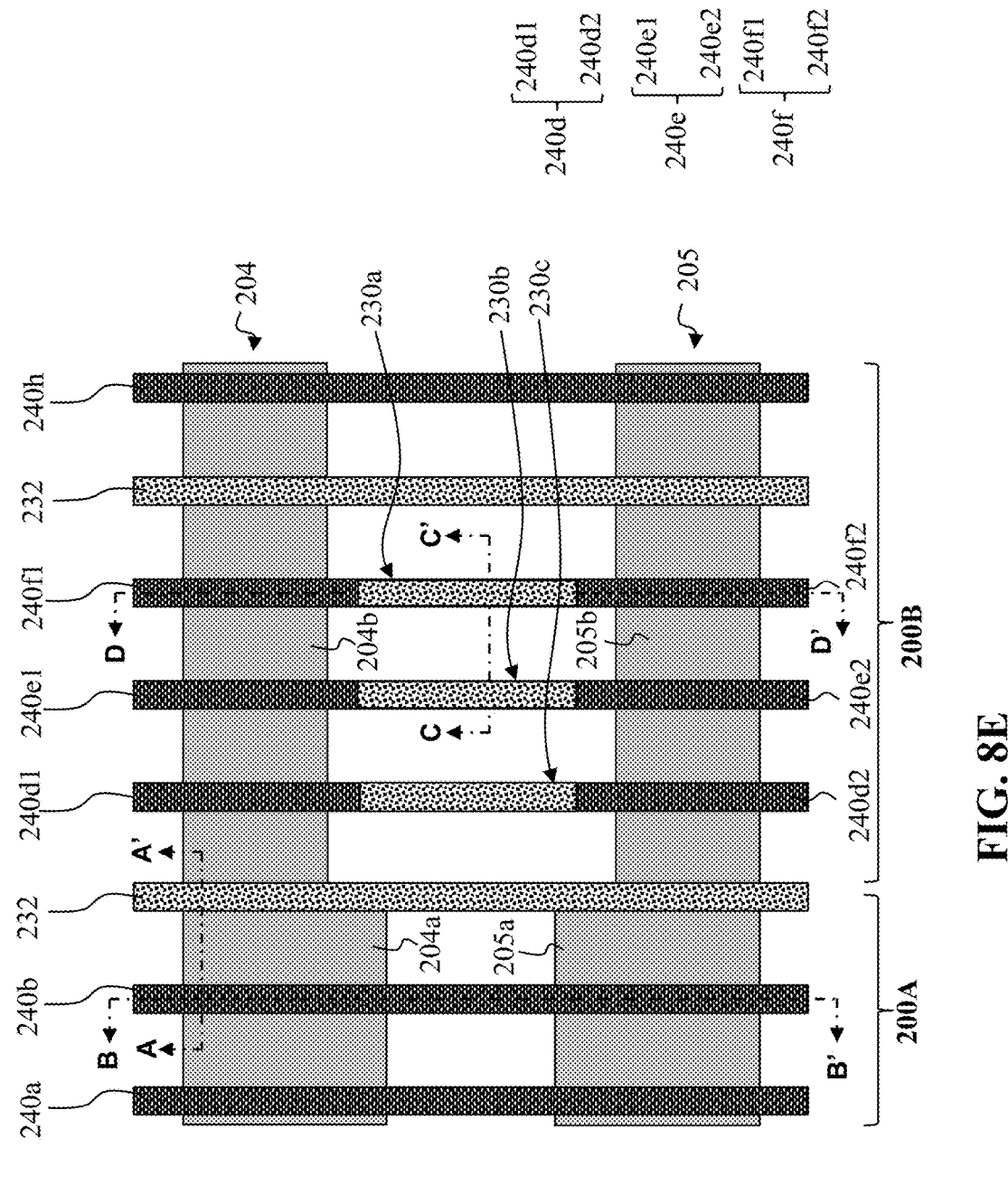
Figures 9A, 9B, 9C, 9D:
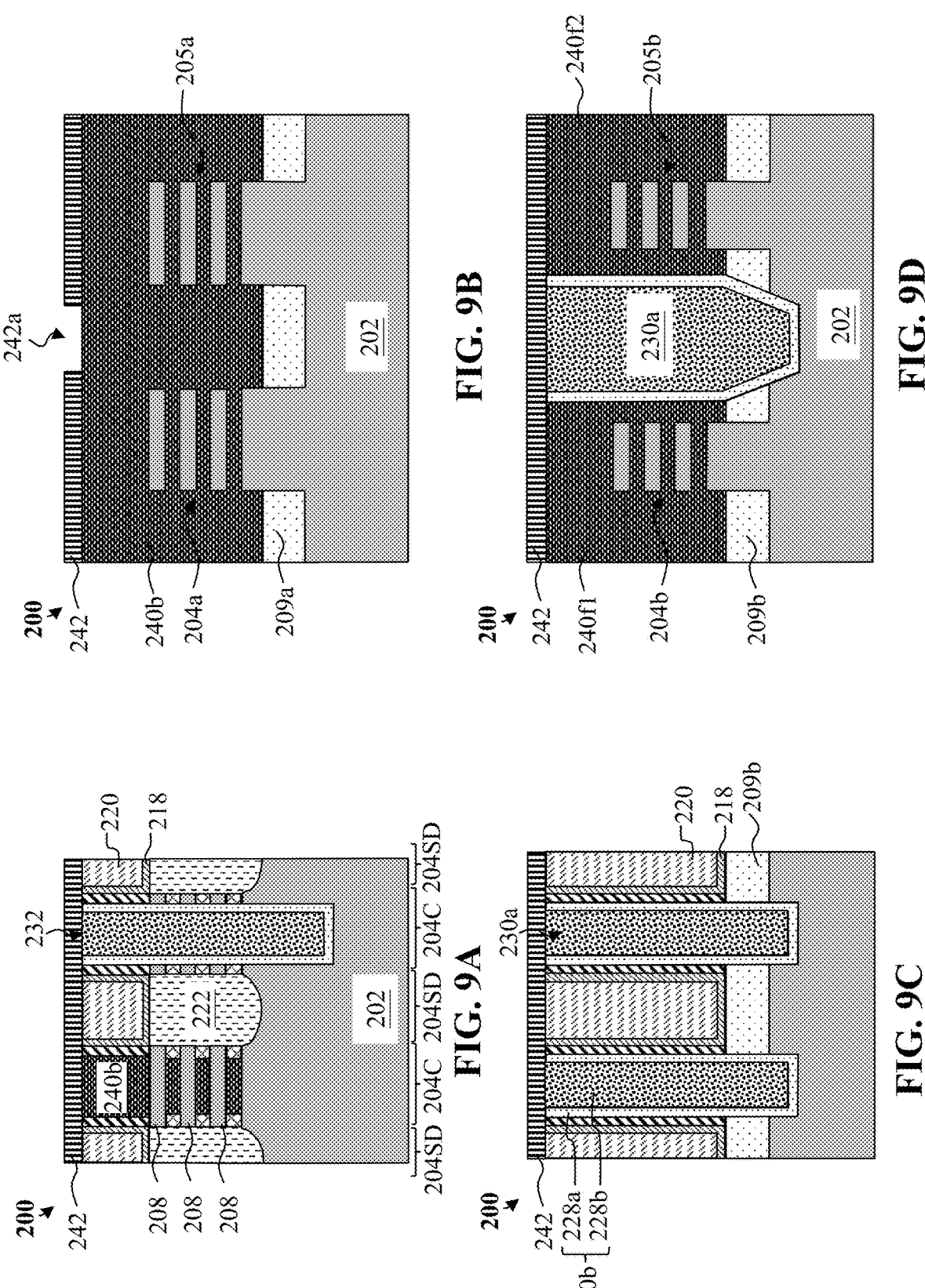

As depicted in FIG. 8E, the gate stack 240d has a first portion 240d1 formed directly over the second portion 204b of the fin-shaped active region 204 and a second portion 240d2 formed directly over the second portion 205b of the fin-shaped active region 205, and the first portion 240d1 and the second portion 240d2 are in direct contact with and separated by the first-type gate isolation structure 230c. In some embodiments, as depicted in the top view represented by FIG. 8E, along the Y direction, sidewalls of the first portion 240d1 of the gate stack 240d are aligned with sidewalls of the second portion 240d2 of the gate stack 240d, and sidewalls of the first-type gate isolation structure 230c are also aligned with sidewalls of the second portion 240d2 of the gate stack 240d. The gate stack 240e has a first portion 240e1 formed directly over the second portion 204b of the fin-shaped active region 204 and a second portion 240e2 formed directly over the second portion 205b of the fin-shaped active region 205, and the first portion 240e1 and the second portion 240e2 are in direct contact with and separated by the first-type gate isolation structure 230b. The gate stack 240f has a first portion 240f1 formed directly over the second portion 204b of the fin-shaped active region 204 and a second portion 240f2 formed directly over the second portion 205b of the fin-shaped active region 205, and the first portion 240f1 and the second portion 240f2 are in direct contact with and separated by the first-type gate isolation structure 230a.

Referring to FIGS. 1 and 9A-9D, method 100 includes a block 116 where a patterned mask film 242 is formed over the workpiece 200 and exposes a portion of the gate stacks formed in the first region 200A. The formation of the patterned mask film 242 is similar to that of the patterned mask film 222 and repeated description is omitted for reason of simplicity. In the present embodiments, the patterned mask film 242 includes an opening 242a exposing a portion of the gate stack 240a formed directly over the isolation feature 209a and a portion of the gate stack 240b formed directly over the isolation feature 209a in the first region 200A.

Referring to FIGS. 1 and 10A-10D, method 100 includes a block 118 where the exposed portions of the gate stacks 240a-240b in the first region 200A are selectively removed to form a second-type gate isolation trench. While using the patterned mask film 242 as an etch mask, an etching process is performed to selectively remove the portions of the gate stacks 240a-240b exposed by the patterned mask film 242 to form the second-type gate isolation trench 244 in the first region 200A. In the present embodiments, the etching process removes a portion of the gate stack 240a formed directly over the isolation feature 209a and a portion of the gate stack 240b formed directly over the isolation feature 209a. The second-type gate isolation trench 244 further extends into the isolation feature 209a. In some embodiments, a depth of the second-type gate isolation trench 244 is less than a depth of the first-type gate isolation trench 224a. The second-type gate isolation trench 244 is configured to cut two adjacent gate stacks 240a-240b in the first region 200A. In some other embodiments, the second-type gate isolation trench 244 may be configured to cut other number (e.g., one, three or more) gate stacks in the first region 200A. The workpiece 200 may include more gate stacks in the first region 200A and may include more than one second-type gate isolation trench 244. The patterned mask film 242 may be selectively removed after the formation of the second-type gate isolation trench 244.

Referring to FIGS. 1, 11A-11E, method 100 includes a block 120 where a second-type gate isolation structure 246 is formed in the second gate isolation trench 244. In some embodiments, the formation of the second-type gate isolation structure 246 is similar to the formation of the first-type gate isolation structures 230a-230c. For example, the second-type gate isolation structure 246 may include a fourth dielectric layer and a third dielectric layer extending along sidewall and bottom surfaces of the fourth dielectric layer. The composition of the second-type gate isolation structure 246 may be same as or different from the composition of the first-type gate isolation structures 230a-230c. In an embodiment, the fourth dielectric layer includes silicon nitride, and the third dielectric layer includes silicon oxide. In some embodiments, the second-type gate isolation structure 246 may be a single layer structure.

Figures 11A, 11B, 11C, 11D:
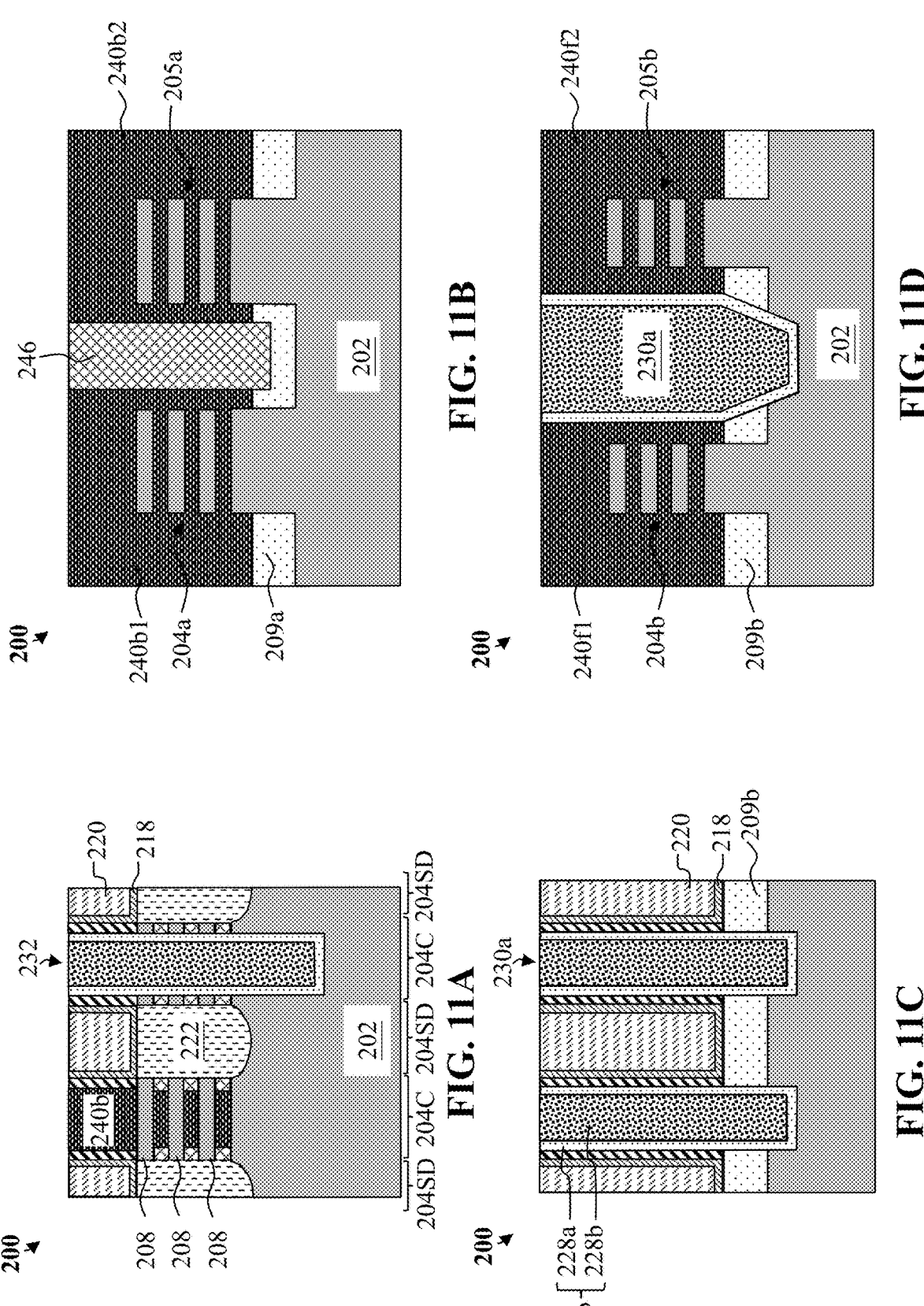
Figure 11E:
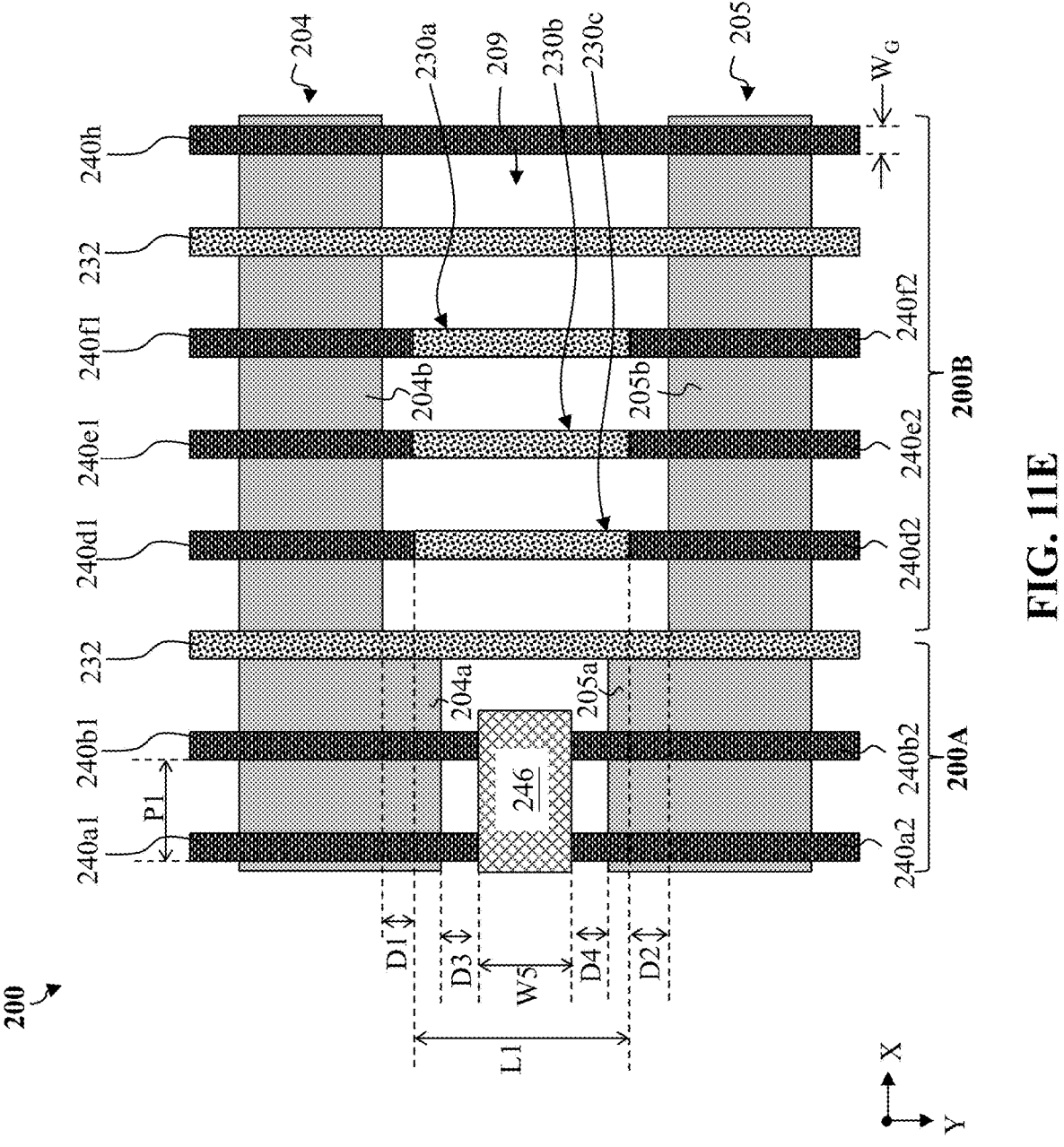

In embodiments represented in FIGS. 11B and 11E, the second-type gate isolation structure 246 divides the gate stack 240b into two electrically and physically isolated portions 240b1 and 240b2. As depicted in FIG. 11E, in the present embodiments, the second-type gate isolation structure 246 further cuts the gate stack 240a into two electrically and physically isolated portions 240a1 and 240a2. That is, different from the first-type gate isolation structure 230a, 230b, or 230c that cuts one gate stack into two portions, the second-type gate isolation structure 246 may cut one or more gate stacks. The second-type gate isolation structure 246 tracks the shape of the second gate isolation trench 244. In some embodiments, a depth of the second gate isolation trench 244 is less than a depth of the first-type gate isolation structure 230*a*, 230*b*, or 230*c*.

As depicted in FIG. 11E, the first-type gate isolation structure 230*a*/230*b*/230*c* extends lengthwise along the Y direction, the second-type gate isolation structure 246 extends lengthwise along the X direction that is substantially perpendicular to the Y direction. The second-type gate isolation structure 246 has a width W5 along the Y direction. In an embodiment, the width W5 is less than the length L1 of the first-type gate isolation structure 230*a*/230*b*/230*c*. The second-type gate isolation structure 246 is spaced apart from the first portion 204*a* of the fin-shaped active region 204 by a distance D3 and spaced apart from the first portion 205*a* of the fin-shaped active region 205 by a distance D4. In an embodiment, the distance D3 is equal to the distance D4. In some embodiments, the distance D3 may be different than the distance D1. In an embodiment, the distance D3 is equal to the distance D1, and the distance D4 is equal to the distance D2. The second-type gate isolation structure 246 has a length along the X direction. In the present embodiments, the length of the second-type gate isolation structure 246 is greater than a sum of the gate pitch P1 and the gate width WG to cut the gate stacks 240*a* and 240*b* into segments. By forming different types of gate isolation structures in different regions (e.g., forming the second-type gate isolation structure 246 in the first region 200A and forming the first-type gate isolation structures 230*a*-230*c* in the second region 200B), without sacrificing the benefits provided by using different fin widths in the critical path and non-critical path while achieving satisfactory circuit function, a parasitic capacitance of the semiconductor structure 200 may be advantageously reduced.

Referring to FIG. 1, method 100 includes a block 122 where further processes are performed. Such further processes may include forming a silicide layer (not depicted) over the source/drain features 216 and a multi-layer interconnect (MLI) structure (not depicted) over the workpiece 200. The MLI may include various interconnect features, such as vias and conductive lines, disposed in dielectric layers, such as etch-stop layers and ILD layers (such as ILD layer 220). In some embodiments, the vias are vertical interconnect features configured to interconnect device-level contacts, such as the source/drain contacts formed over the source/drain features 216 and gate vias (not depicted) formed over the gate stacks.

In the above embodiments described with reference to FIGS. 2-11E, the first-type gate isolation structures 230*a*-230*c* formed in the second region 200B have the same length L1. In some other embodiments, to provide enough landing area for gate via(s) that will be formed over the gate stack(s), the lengths of the first-type gate isolation structures 230*a*-230*c* may be different. For example, in embodiments represented in FIG. 12, the first-type gate isolation structures 230*a*-230*c* in the second region 200B have different lengths. In an embodiment, a length of the first-type gate isolation structure 230*a* and a length of the first-type gate isolation structure 230*b* are less than the length of the first-type gate isolation structure 230*c*. The workpiece 200 includes a gate via 250*a* and a gate via 250*b* formed over the first portion 240*f*1 of the gate stack and the second portion 240*e*2 of the gate stack, respectively. In the above embodiments described with reference to FIGS. 2-11E, the second-type gate isolation structure 246 is spaced apart from the CPODE structure 232. In some other embodiments, the second-type gate isolation structure 246 may be in direct contact with the CPODE structure 232.

In the above embodiments described with reference to FIGS. 2-11E, both the fin-shaped active region 204 and the fin-shaped active region 205 have non-uniform widths. In some other embodiments, one of the fin-shaped active region 204 and the fin-shaped active region 205 may have a uniform width. For example, in embodiment represented in FIG. 13, the fin-shaped active region 204 has a uniform width W2 across the first region 200A and the second region 200B, and the fin-shaped active region 205 has the width W3 in the first region 200A and the width W4 in the second region 200B, and W3 is greater than W4. However, the separation distance between the fin-shaped active region 204 and the fin-shaped active region 205 is still not uniform. More specifically, a separation distance S3 between the fin-shaped active region 204 and the first portion 205*a* of the fin-shaped active region 205 in the first region 200A is less than a separation distance S4 between the fin-shaped active region 204 and the second portion 205*b* of the fin-shaped active region 205 in the second region 200B. The first-type gate isolation structures 230*a*-230*c* may be formed in the second region 200B having a greater separation distance between two (or two portions of) adjacent active regions, and the second-type gate isolation structure 246 may be formed in the first region 200A having a smaller separation distance between two (or two portions of) adjacent active regions.

In the above embodiments described with reference to FIGS. 2-13, the first-type and second-type gate isolation structures are implemented in standard cells. The first-type and second-type gate isolation structures may also be implemented in other applications, such as a memory cell. FIG. 14 depicts a fragmentary top view of a two-port static random-access memory (SRAM) cell 400. The cell 400 includes a write port (or write port portion) 400W and a read port (or a read port portion) 400R. The write port 400W includes two P-type metal-oxide-semiconductor (PMOS) transistors as pull-up transistors W_PU-1 and W_PU-2, two N-type metal-oxide-semiconductor (NMOS) transistors as pull-down transistors W_PD-1 and W_PD-2, and two NMOS transistors as pass-gate (or access) transistors W_PG-1 and W_PG-2. The W_PU-1 and W_PD-1 are coupled to form an inverter. The W_PU-2 and W_PD-2 are coupled to form another inverter. The two inverters are cross-coupled to form data storage nodes. The W_PG-1 and W_PG-2 are coupled to the data storage nodes for writing thereto. The read port 400R includes an NMOS transistor as a pull-down transistors R_PD and another NMOS transistor as a pass-gate (or access) transistor R_PG. In an embodiment, each of the transistors in the cell 400 may be a fin-shaped field-effect transistor (FinFET) or a gate-all-around (GAA) transistor.

In embodiments represented in FIG. 14, the cell 400 includes active regions 405*a*, 405*b*, 405*c*, 405*d*, and 405*e* extending lengthwise along the X direction. In the present embodiments, two adjacent active regions in the write port 400W are separated by a same separation distance SW. For example, the active region 405*a* and the active region 405*b* are separated by the separation distance SW. The active region 405*d* and the active region 405*e* in the read port 400R are separated by a separation distance SR that is greater than the separation distance SW. The cell 400 includes gate stacks 410*a* and 410*b* extending lengthwise along the Y direction perpendicular to the X direction. The gate stack 410*a* engages the active regions 405*a*, 405*b*, 405*d* and 405*e* to form the transistors W_PD-1, W_PU-1, W_PG-2 and R_PG, respectively. The gate stack 410*b* engages the active regions 405*a*, 405*c*, 405*d* and 405*e* to form the transistors W_PG-1, W_PU-2, W_PD-2 and R_PD, respectively.

To perform satisfactory functions, each of the gate stack 410*a* and the gate stack 410*b* is cut into pieces by gate isolation structures. For example, a gate isolation structure 415*a* is configured to cut the gate stack 410*b* such that a gate stack of the transistor W_PG-1 is isolated from a gate stack of the transistor W_PU-2, a gate isolation structure 415*b* is configured to cut the gate stack 410*a* such that a gate stack of the transistor W_PG-2 is isolated from a gate stack of the transistor W_PU-1, and a gate isolation structure 415*c* is configured to cut the gate stack 410*a* such that the gate stack of the transistor W_PG-2 is isolated from a gate stack of the transistor R_PG. The gate isolation structures 415*a* and 415*b* are formed in the write port 400W that has the smaller separation distance SW, and the gate isolation structure 415*c* is formed in the read port 400R that has the greater separation distance SR. Thus, to reduce parasitic capacitance of the cell 400, the gate isolation structures 415*a* and 415*b* may be the second-type gate isolation structures described above, and the gate isolation structure 415*c* may be the first-type gate isolation structure described above. The gate stack 410*a* and the gate stack 410*b* extend lengthwise along the Y direction, the gate isolation structures 415*a* and 415*b* extend lengthwise along the X direction perpendicular to the Y direction, and the gate isolation structure 415*c* extends lengthwise along the Y direction. In an embodiment, a length LR of the gate isolation structure 415*c* is greater than a width WW of the gate isolation structures 415*a* and 415*b*.

Although not intended to be limiting, one or more embodiments of the present disclosure provide many benefits to semiconductor structures and the formation thereof. For example, the present disclosure provides different types of gate isolation structures for different regions having different active region separation distances, and methods of forming the same. More specifically, for a first region having a small separation distance between two adjacent active regions or portion of the two adjacent active regions, a first-type gate isolation structure that extends lengthwise along a direction perpendicular to the lengthwise direction of the gate structures may be formed, and for a second region having a larger separation distance between two adjacent active regions or portion of the two adjacent active regions, a second-type gate isolation structure that extends lengthwise along a direction same to the lengthwise direction of the gate structures may be formed. By implementing different types of gate isolation structures in different regions, parasitic capacitance of the semiconductor structure may be advantageously reduced, the overall performance of the semiconductor structure may be improved.

The present disclosure provides for many different embodiments. Semiconductor structures and methods of fabrication thereof are disclosed herein. In one exemplary aspect, the present disclosure is directed to a method. The method includes receiving a workpiece having a first region and a second region, the workpiece comprising a first active region and a second active region in the first region and spaced apart by a first spacing, a first isolation feature disposed between the first and second active regions, a first dummy gate structure engaging the first and second active regions and having a first portion in direct contact with the first isolation feature, a third active region and a fourth active region in the second region and spaced apart by a second spacing different from the first spacing, a second isolation feature disposed between the third and fourth active regions, and a second dummy gate structure engaging the third and fourth active regions and having a second portion in direct contact with the second isolation feature. The method also includes performing a first etching process to remove the first portion of the first dummy gate structure and a portion of the first isolation feature thereunder to form a first trench, forming a first gate isolation structure in the first trench, selectively removing a remaining portion of the first dummy gate structure and the second dummy gate structure to form a first gate opening and a second opening, respectively, forming a first gate stack and a second gate stack in the first gate opening and the second opening, respectively, wherein the first gate stack engages the first and second active regions, performing a second etching process to remove the second gate stack and a portion of the second isolation feature thereunder to form a second trench, and forming a second gate isolation structure in the second trench.

In some embodiments, the forming of the first gate isolation structure may include conformally depositing a first dielectric layer over the workpiece and in the first trench, and depositing a second dielectric layer over the first dielectric layer to fill a remaining portion of the first trench. In some embodiments, a composition of the second gate isolation structure may be the same as a composition of the first gate isolation structure. In some embodiments, the performing of the first etching process may also remove a portion of a substrate disposed directly under the portion of the first isolation feature. In some embodiments, the workpiece may also include a third dummy gate structure engaging the first and second active regions and disposed directly over the first and second isolation feature, and the performing of the first etching process may also remove an entirety of the third dummy gate structure, portions of the first and second active regions thereunder, and portions of the first and second isolation features thereunder to form a third trench, and the conformally depositing of the first dielectric layer and the depositing of the second dielectric layer may also form a hybrid isolation structure in the third trench. In some embodiments, the first and second gate stacks extend lengthwise along a first direction, the first gate isolation structure extends lengthwise along the first direction, and the second gate isolation structure may extend lengthwise along a second direction substantially perpendicular to the first direction. In some embodiments, the first active region has a first width along the first direction, the third active region has a width along the first direction and greater than the first width. In some embodiments, the first gate isolation structure has a first length along the first direction, the second gate isolation structure has a second width along the first direction and less than the first length. In some embodiments, in a top view, a distance between the first gate isolation structure and the first active region is equal to a distance between the second gate isolation structure and the third active region. In some embodiments, the first active region and the third active region are portions of a first continuous active region. In some embodiments, each of the first, second, third, and fourth active regions may include a plurality of channel layers interleaved by a plurality of sacrificial layers, the method may also include, after the selectively removing of the remaining portion of the first dummy gate structure and the second dummy gate structure, selectively removing the plurality of sacrificial layers, each of the first gate stack and the second gate stack wraps around a corresponding plurality of channel layers.

In another exemplary aspect, the present disclosure is directed to a method. The method includes forming a fin-like structure over a substrate, forming an isolation feature in the substrate and adjacent to the fin-like structure, forming a first dummy gate structure across the fin-like structure, wherein the first dummy gate structure comprises a first portion disposed directly over the fin-like structure and a second portion disposed directly over a first portion of the isolation feature, forming source/drain features adjacent to the first portion of the first dummy gate structure, forming a mask film to cover the first portion of the first dummy gate structure while exposing the second portion of the first dummy gate structure, removing the second portion of the first dummy gate structure and the first portion of the isolation feature thereunder to form a first gate isolation trench, forming a first gate isolation structure in the first gate isolation trench, and replacing the first portion of the first dummy gate structure with a first gate stack.

In some embodiments, the first gate isolation structure and the first gate stack extend lengthwise along a same direction. In some embodiments, the method may also include forming a second dummy gate structure engaging the fin-like structure, where the mask film further exposes an entirety of the second dummy gate structure, where the second dummy gate structure, a portion of the fin-like structure, a portion of the isolation feature thereunder are removed along with the removing of the second portion of the first dummy gate structure and the first portion of the isolation feature to form a second gate isolation trench, and where a second gate isolation structure is formed in the second gate isolation trench along with the forming of the first gate isolation structure. In some embodiments, the method may also include forming a second dummy gate structure and a third dummy gate structure across the fin-like structure, replacing the second and third dummy gate structures with a second gate stack and a third gate stack, respectively, wherein each of the second and third gate stacks comprises a first portion disposed directly over the isolation feature, after the forming of the first gate isolation structure, removing the first portions of the second and third gate stacks to form a second gate isolation trench exposing the isolation feature, and forming a second gate isolation structure in the second gate isolation trench, where a length of a portion of the second gate stack disposed directly over the fin-like structure may be greater than a length of a portion of the first gate stack disposed directly over the fin-like structure. In some embodiments, in a top view, the first gate isolation structure and the second gate isolation structure extend lengthwise along different directions.

In yet another exemplary aspect, the present disclosure is directed to a semiconductor structure. The semiconductor structure includes a first vertical stack of channel members disposed over a substrate, a first gate stack wrapping around each channel member of the first vertical stack of channel members, first source/drain features coupled to the first vertical stack of channel members and adjacent the first gate stack, a second vertical stack of channel members disposed over the substrate and spaced apart from the first vertical stack of channel members, a second gate stack wrapping around each channel member of the second vertical stack of channel members, second source/drain features coupled to the second vertical stack of channel members and adjacent the second gate stack, and a first isolation structure disposed between and in direct contact with the first gate stack and the second gate stack and extending into the substrate, where the first gate stack is isolated from the second gate stack by the first isolation structure, and wherein, in a top view, the first isolation structure, the first gate stack, and the second gate stack extend lengthwise along a same direction.

In some embodiments, the semiconductor structure may also include a third vertical stack of channel members disposed over the substrate, a fourth vertical stack of channel members disposed over the substrate, a third gate stack wrapping around each channel member of the third vertical stack of channel members and extending lengthwise along a first direction, a fourth gate stack wrapping around each channel member of the fourth vertical stack of channel members and extending lengthwise along the first direction, and a second isolation structure disposed between and in direct contact with the third gate stack and the fourth gate stack, where the third gate stack is isolated from the fourth gate stack by the second isolation structure, and in the top view, the second isolation structure extends lengthwise along a second direction that is substantially perpendicular to the first direction. In some embodiments, the semiconductor structure may also include an isolation feature on the substrate and disposed between the first vertical stack of channel members and the second vertical stack of channel members. Portions of the first gate stack and the second gate stack are over and in direct contact with the isolation feature, and in a top view, an entirety of the first isolation structure may be disposed directly over the isolation feature. In some embodiments, a distance between the third vertical stack of channel members and the fourth vertical stack of channel members may be less than a distance between the first vertical stack of channel members and the second vertical stack of channel members.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece having a first region and a second region, the workpiece comprising:

a first active region and a second active region in the first region and spaced apart by a first spacing, a first isolation feature disposed between the first and second active regions, a first dummy gate structure extending over the first and second active regions and having a first portion disposed directly over the first isolation feature, a third active region and a fourth active region in the second region and spaced apart by a second spacing different from the first spacing, a second isolation feature disposed between the third and fourth active regions, and a second dummy gate structure extending over the third and fourth active regions and having a second portion disposed directly over the second isolation feature;

performing a first etching process to remove the first portion of the first dummy gate structure and a portion of the first isolation feature thereunder to form a first trench;

forming a first gate isolation structure in the first trench;

selectively removing a remaining portion of the first dummy gate structure and the second dummy gate structure to form a first gate opening and a second opening, respectively;

forming a first gate stack and a second gate stack in the first gate opening and the second opening, respectively, wherein the first gate stack engages the first and second active regions;

performing a second etching process to remove a portion of the second gate stack and a portion of the second isolation feature thereunder to form a second trench; and forming a second gate isolation structure in the second trench.

2. The method of claim 1, wherein the forming of the first gate isolation structure comprises:

conformally depositing a first dielectric layer over the workpiece and in the first trench; and depositing a second dielectric layer over the first dielectric layer to fill a remaining portion of the first trench.

3. The method of claim 2, wherein a composition of the second gate isolation structure is the same as a composition of the first gate isolation structure.

4. The method of claim 2, wherein the performing of the first etching process further removes a portion of a substrate disposed directly under the portion of the first isolation feature.

5. The method of claim 2, wherein the workpiece further comprising:

a third dummy gate structure extending over the first and second active regions and disposed directly over the first and second isolation feature, wherein the performing of the first etching process further removes an entirety of the third dummy gate structure, portions of the first and second active regions thereunder, and portions of the first and second isolation features thereunder to form a third trench, and wherein the conformally depositing of the first dielectric layer and the depositing of the second dielectric layer further forms a hybrid isolation structure in the third trench.

6. The method of claim 1, wherein the first and second gate stacks extend lengthwise along a first direction, the first gate isolation structure extends lengthwise along the first direction, and the second gate isolation structure extends lengthwise along a second direction substantially perpendicular to the first direction.

7. The method of claim 6, wherein, the first active region has a first width along the first direction, the third active region has a width along the first direction and greater than the first width.

8. The method of claim 6, wherein, the first gate isolation structure has a first length along the first direction, the second gate isolation structure has a second width along the first direction and less than the first length.

9. The method of claim 1, wherein, in a top view, a distance between the first gate isolation structure and the first active region is equal to a distance between the second gate isolation structure and the third active region.

10. The method of claim 1, wherein, the first active region and the third active region are portions of a first continuous active region.

11. The method of claim 1, wherein each of the first, second, third, and fourth active regions comprises a plurality of channel layers interleaved by a plurality of sacrificial layers, wherein the method further comprises:

after the selectively removing of the remaining portion of the first dummy gate structure and the second dummy gate structure, selectively removing the plurality of sacrificial layers, wherein each of the first gate stack and the second gate stack wraps around a corresponding plurality of channel layers.

12. A method, comprising:

forming a fin-like structure over a substrate;

forming an isolation feature over the substrate and adjacent to the fin-like structure;

forming a first dummy gate structure across the fin-like structure, wherein the first dummy gate structure comprises a first portion disposed directly over the fin-like structure and a second portion disposed directly over a first portion of the isolation feature;

forming source/drain features adjacent to the first portion of the first dummy gate structure;

forming a mask film to cover the first portion of the first dummy gate structure while exposing the second portion of the first dummy gate structure;

removing the second portion of the first dummy gate structure and the first portion of the isolation feature thereunder to form a first gate isolation trench;

forming a first gate isolation structure in the first gate isolation trench; and replacing the first portion of the first dummy gate structure with a first gate stack, wherein a height of the first gate isolation structure is greater than a height of the first gate stack.

13. The method of claim 12, wherein the first gate isolation structure and the first gate stack extend lengthwise along a same direction.

14. The method of claim 12, further comprising:

forming a second dummy gate structure extending over the fin-like structure, wherein the mask film further exposes an entirety of the second dummy gate structure, wherein the second dummy gate structure, a portion of the fin-like structure thereunder, a portion of the isolation feature thereunder are removed along with the removing of the second portion of the first dummy gate structure and the first portion of the isolation feature to form a second gate isolation trench, and wherein a second gate isolation structure is formed in the second gate isolation trench along with the forming of the first gate isolation structure.

15. The method of claim 12, further comprising:

forming a second dummy gate structure and a third dummy gate structure across the fin-like structure;

replacing the second and third dummy gate structures with a second gate stack and a third gate stack, respectively, wherein each of the second and third gate stacks comprises a first portion disposed directly over the isolation feature;

after the forming of the first gate isolation structure, removing the first portions of the second and third gate stacks to form a second gate isolation trench exposing the isolation feature; and forming a second gate isolation structure in the second gate isolation trench, wherein a length of a portion of the second gate stack disposed directly over the fin-like structure is greater than a length of a portion of the first gate stack disposed directly over the fin-like structure.

16. The method of claim 15, wherein, in a top view, the first gate isolation structure and the second gate isolation structure extend lengthwise along different directions.

17. A semiconductor structure, comprising:

a first vertical stack of channel members disposed over a substrate;

a first gate stack wrapping around each channel member of the first vertical stack of channel members;

first source/drain features coupled to the first vertical stack of channel members and adjacent the first gate stack;

a second vertical stack of channel members disposed over the substrate and spaced apart from the first vertical stack of channel members;

a second gate stack wrapping around each channel member of the second vertical stack of channel members;

second source/drain features coupled to the second vertical stack of channel members and adjacent the second gate stack; and a first isolation structure disposed between and in direct contact with the first gate stack and the second gate stack and extending into the substrate, wherein the first gate stack is isolated from the second gate stack by the first isolation structure, and wherein, in a top view, the first isolation structure, the first gate stack, and the second gate stack extend lengthwise along a same direction.

18. The semiconductor structure of claim 17, further comprising:

a third vertical stack of channel members disposed over the substrate;

a fourth vertical stack of channel members disposed over the substrate;

a third gate stack wrapping around each channel member of the third vertical stack of channel members and extending lengthwise along a first direction;

a fourth gate stack wrapping around each channel member of the fourth vertical stack of channel members and extending lengthwise along the first direction; and a second isolation structure disposed between and in direct contact with the third gate stack and the fourth gate stack, wherein the third gate stack is isolated from the fourth gate stack by the second isolation structure, and wherein, in the top view, the second isolation structure extends lengthwise along a second direction that is substantially perpendicular to the first direction.

19. The semiconductor structure of claim 18, further comprising:

an isolation feature on the substrate and disposed between the first vertical stack of channel members and the second vertical stack of channel members, wherein, portions of the first gate stack and the second gate stack are over and in direct contact with the isolation feature, and wherein, in the top view, an entirety of the first isolation structure is disposed directly over the isolation feature.

20. The semiconductor structure of claim 18, wherein a distance between the third vertical stack of channel members and the fourth vertical stack of channel members is less than a distance between the first vertical stack of channel members and the second vertical stack of channel members.

* * * * *